(12) United States Patent  
Lin

(10) Patent No.: US 7,705,340 B2  
(45) Date of Patent: Apr. 27, 2010

(54) INFLECTED MAGNETORESISTIVE STRUCTURES AND MEMORY CELLS HAVING INFLECTED MAGNETORESISTIVE STRUCTURES

(75) Inventor: Chun-Chieh Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 164 days.

(21) Appl. No.: 11/163,118

(22) Filed: Oct. 5, 2005

(65) Prior Publication Data

US 2006/0081952 A1    Apr. 20, 2006

Related U.S. Application Data

(60) Provisional application No. 60/615,890, filed on Oct. 5, 2004.

(51) Int. Cl.  
*H01L 47/00* (2006.01)

(52) U.S. Cl. .............. 257/2; 257/295; 257/E43.001

(58) Field of Classification Search ............ 257/421, 257/2, 295, E43.001  
See application file for complete search history.

(56) References Cited

U.S. PATENT DOCUMENTS

| 6,358,756 | B1 | 3/2002 | Sandhu et al. | |
|---|---|---|---|---|
| 6,621,730 | B1 | 9/2003 | Lage | |
| 6,656,844 | B1 | 12/2003 | Lin et al. | |
| 6,784,510 | B1 * | 8/2004 | Grynkewich et al. | 257/421 |
| 2002/0094478 | A1 * | 7/2002 | Holland | 429/211 |
| 2002/0132375 | A1 * | 9/2002 | Doan et al. | 438/3 |
| 2002/0186583 | A1 * | 12/2002 | Tuttle | 365/171 |
| 2003/0089933 | A1 * | 5/2003 | Janesky et al. | 257/295 |
| 2004/0076035 | A1 | 4/2004 | Saito et al. | |
| 2004/0175845 | A1 | 9/2004 | Molla et al. | |
| 2004/0185613 | A1 | 9/2004 | Lin et al. | |

OTHER PUBLICATIONS

CN2005101059963 Office Action mailed Oct. 9, 2009.

* cited by examiner

*Primary Examiner*—Hoai V Pham  
(74) *Attorney, Agent, or Firm*—Baker & McKenzie LLP

(57) ABSTRACT

Disclosed herein is a magnetoresistive structure having a non-planar form. Embodiments of the present MR structure includes those having at least one inflection between a first portion of the MR structure that is somewhat vertical relative to a substrate and a second portion of the MR structure that is somewhat horizontal relative to the substrate. Such a structure can be used for memory device, for example an MRAM memory device, wherein the memory density is increased compared to devices having prior planar MR structures without reducing the surface area of the MR structures.

19 Claims, 21 Drawing Sheets

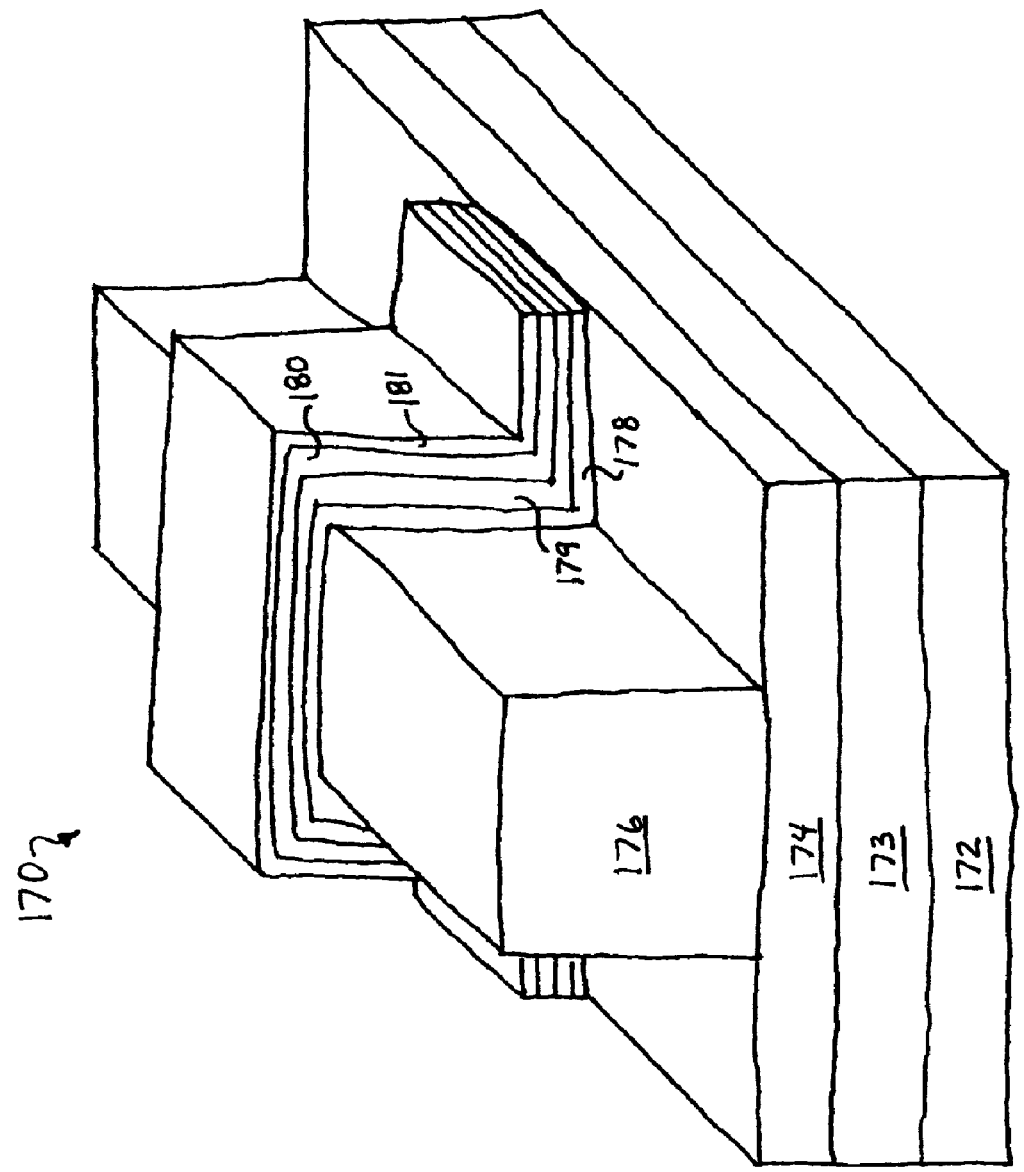

INFLECTED MAGNETORESISTIVE STRUCTURES AND MEMORY CELLS HAVING INFLECTED MAGNETORESISTIVE STRUCTURES

TECHNICAL FIELD

The present invention relates generally to semiconductor devices, and more particularly to a magnetic random access memory (MRAM) device.

BACKGROUND

Magnetic random access memory (MRAM) is a non-volatile memory that uses magnetism rather than electrical power to store data. FIG. 1 shows a schematic diagram of a portion 10 of an MRAM array, which includes a plurality of memory cells 12-19. Each memory cell 12-19 includes a magnetoresistive (MR) stack 20-27 and a transistor 30-37. The transistors 30-33 are coupled to each other via a word line (WL1) 40, and transistors 34-37 are coupled to each other via a word line (WL2) 41, where the word lines 40, 41 form the gate electrode for the transistors 30-37. The transistors 30-33 are also coupled to each other via a program line (PL1) 42, and transistors 34-37 are coupled via a program line (PL2) 43, where the program lines 42, 43 serve as virtual ground lines. Similarly, the MR stacks 20 and 24 are coupled to each other by bit line (BL1) 45, MR stacks 21 and 25 are coupled to each other by bit line (BL2) 46, MR stacks 22 and 26 are coupled to each other by bit line (BL3) 47, and MR stacks 23 and 27 are coupled to each other by bit line (BL4) 48. The bit lines 45-48 are typically somewhat perpendicular to the word lines 40, 41 and the program lines 42, 43.

Each of the MR stacks 20-27 is a multi-layer magnetoresistive structure, such as a magnetic tunnel junction (MTJ) or a giant magnetoresistive (GMR) structure. FIG. 2 shows an example of a typical MTJ structure 50. The MTJ structure 50 is a planar structure that includes four basic layers: a free layer 52, a spacer 54 which serves as a tunnel barrier, a pinned layer 56, and a pinning layer 58. The free layer 52 and the pinned layer 56 are constructed of ferromagnetic material, for example cobalt-iron or nickel-cobalt-iron. The pinning layer 58 is constructed of antiferromagnetic material, for example platinum manganese. Magnetostatic coupling between the pinned layer 56 and the pinning layer 58 causes the pinned layer 56 to have a fixed magnetic moment. The free layer 52, on the other hand, has a magnetic moment that, by application of a magnetic field, can be switched between a first orientation, which is parallel to the magnetic moment of the pinned layer 56, and a second orientation, which is antiparallel to the magnetic moment of the pinned layer 56.

The spacer 54 interposes the pinned layer 56 and the free layer 52. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 52 and the pinned layer 56 are parallel. On the other hand, when the magnetic moments of the free layer 52 and the pinned layer 56 are antiparallel, the probability of electrons tunneling through the spacer 54 is reduced. This phenomenon is commonly referred to as spin-dependent tunneling (SDT).

As shown in FIG. 3, the electrical resistance through the MTJ 50 (e.g., through layers 52-58) increases as the moments of the pinned and free layers become more antiparallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0". The logic states thus stored in the memory cells can be read by passing a sense current through the MR stack and sensing the resistance. For example, referring back to FIG. 1, the logic state of memory cell 12 can be read by passing a sense current through bit line (BL1) 45, activating transistor 30 via word line (WL1) 40, and sensing the current passing to program line (PL1) 42.

During a write operation, electrical current flows through a program line 42, 43 and a bit line 45-48 that intersect at the target memory cell 12-19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR stacks 20-23 and 25, but the combination of the two magnetic fields (at MR stack 21) is sufficient for switching the memory state (e.g., switching the magnetic moment of the free layer 52) of the MR stack 21.

SUMMARY

Disclosed herein is a magnetoresistive structure having a non-planar form. Embodiments of the present MR structure includes those having at least one inflection between a first portion of the MR structure that is somewhat vertical relative to a substrate and a second portion of the MR structure that is somewhat horizontal relative to the substrate. Such a structure can be used for a memory device, for example an MRAM memory device, wherein the memory density is increased compared to devices having prior planar MR structures without reducing the surface area of the MR structures.

BRIEF DESCRIPTION OF THE DRAWINGS

Embodiments are illustrated by way of example in the accompanying figures, in which like reference numbers indicate similar parts, and in which:

FIG. 10A shows a perspective view of a fourth embodiment of memory cell having an inflected MR structure;

DESCRIPTION OF THE EMBODIMENTS

FIGS. 4A-4H show several embodiments of inflected magnetoresistive (MR) structures that can be used in a variety of applications, for example in magnetic sensing or storage devices. An example of a storage device application is an MRAM device. In an MRAM device, the MR structures can be magnetic tunnel junctions (MTJs) that include, e.g., a pair of ferromagnetic layers separated by a nonmagnetic spacer. By incorporating an inflection in the MR structures as disclosed herein and exemplified in the following embodiments, the area required for an MRAM memory cell can be reduced without reducing the surface area of the MTJ. Thus, the inflected MR structures disclosed herein can be implemented in order to increase the density of an MRAM array while maintaining.

Figure 4A:
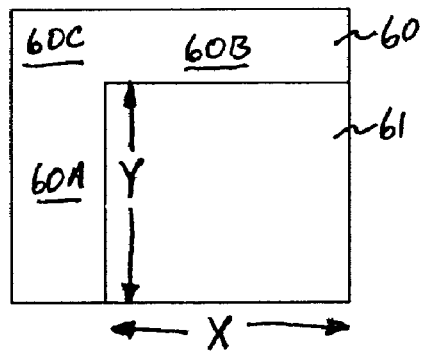
FIGS. 4A through 4H show several embodiments of inflected magnetoresistive structures.

FIG. 4A shows a cross-sectional side view of a first embodiment comprising an inflected MR structure 60 formed along a side surface and over a top surface of a substrate 61. More specifically, the MR structure 60 includes a first portion 60A that extends for a distance Y along a side of the substrate 61 and a second portion 60B that extends for a distance X over a top surface of the substrate 61. The first and second portions 60A and 60B are separated by an inflection portion 60C of the MR structure 60.

Figure 4B:
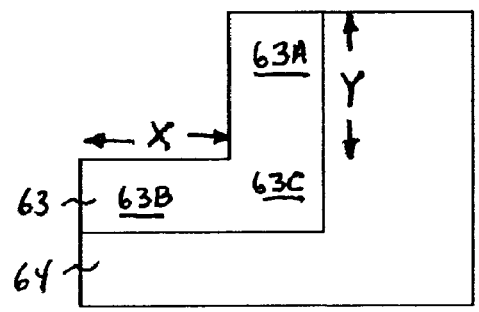

FIG. 4B shows a cross-sectional side view of a second embodiment comprising an MR structure 63 formed along a side surface and over a top surface of a substrate 64. More specifically, the MR structure 63 includes a first portion 63A that extends for a distance Y along a side of the substrate 64 and a second portion 63B that extends for a distance X over an intermediate-upper surface of the substrate 64. The first and second portions 63A and 63B are separated by an inflection portion 63C of the MR structure 63.

Figure 4C:
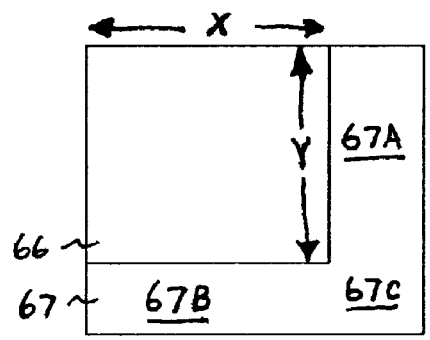

FIG. 4C shows a cross-sectional side view of a third embodiment comprising an MR structure 67 formed along a side surface and across a lower surface of a substrate 66. More specifically, the MR structure 67 includes a first portion 67A that extends for a distance Y along a side of the substrate 66 and a second portion 67B that extends for a distance X across a lower surface of the substrate 66. The first and second portions 67A and 67B are separated by an inflection portion 67C of the MR structure 67.

Figure 4D:
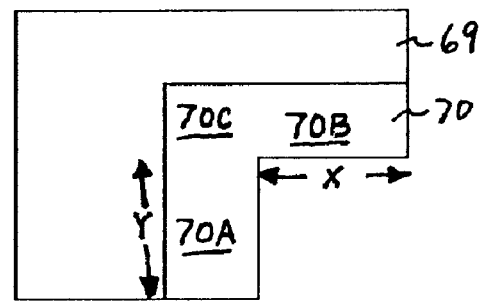

FIG. 4D shows a cross-sectional side view of a fourth embodiment comprising an MR structure 70 formed along a side surface and across an intermediate-lower surface of a substrate 69. More specifically, the MR structure 70 includes a first portion 70A that extends for a distance Y along a side of the substrate 69 and a second portion 70B that extends for a distance X across the intermediate-lower surface of the substrate 69. The first and second portions 70A and 70B are separated by an inflection portion 70C of the MR structure 70.

Figure 4E:
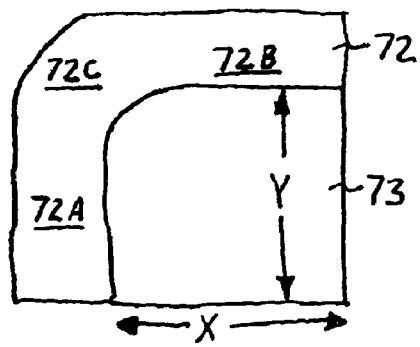

FIG. 4E shows a cross-sectional side view of a fifth embodiment comprising an MR structure 72 formed along a side surface and over a top surface of a substrate 73. More specifically, the MR structure 72 includes a first portion 72A that extends for a distance Y along the side of the substrate 73 and a second portion 72B that extends for a distance X over the top surface of the substrate 73. The first and second portions 72A and 72B are separated by an inflection portion 72C of the MR structure 72.

Figure 4F:
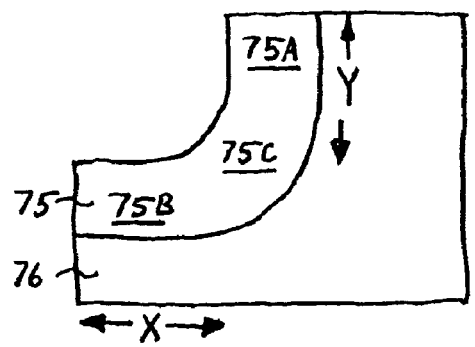

FIG. 4F shows a cross-sectional side view of a sixth embodiment comprising an MR structure 75 formed along a side surface and over an intermediate-top surface of a substrate 76. More specifically, the MR structure 75 includes a first portion 75A that extends for a distance Y along the side of the substrate 76 and a second portion 75B that extends for a distance X over the intermediate-top surface of the substrate 76. The first and second portions 75A and 75B are separated by an inflection portion 75C of the MR structure 75.

Figure 4G:
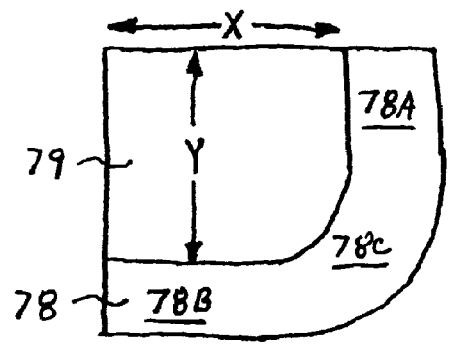

FIG. 4G shows a cross-sectional side view of a seventh embodiment comprising an MR structure 78 formed along a side surface and over a lower surface of a substrate 79. More specifically, the MR structure 78 includes a first portion 78A that extends for a distance Y along the side of the substrate 79 and a second portion 78B that extends for a distance X across the lower surface of the substrate 79. The first and second portions 78A and 78B are separated by an inflection portion 78C of the MR structure 78.

Figure 4H:
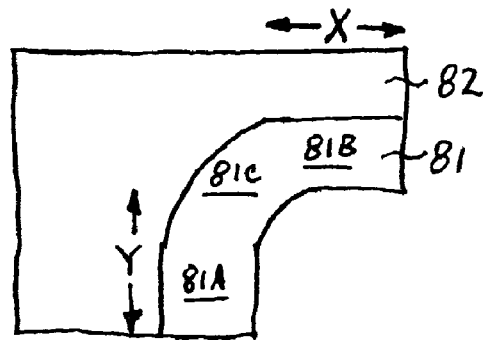

FIG. 4H shows a cross-sectional side view of an eighth embodiment comprising an MR structure 81 formed along a side surface and across an intermediate-lower surface of a substrate 82. More specifically, the MR structure 81 includes a first portion 81A that extends for a distance Y along the side of the substrate 82 and a second portion 81B that extends for a distance X across the intermediate-lower surface of the substrate 82. The first and second portions 81A and 81B are separated by an inflection portion 81C of the MR structure 81.

In the above embodiments, the distance X and the distance Y can be equal or unequal. The distance X can be, for example, any distance greater than 10 Å, for example distances in a range of 10 Å to 500 Å, distances in a range of 10 Å to 100 Å, and distances in a range of 100 Å to 500 Å. The distance Y can be, for example, any distance greater than 10 Å, for example distances in a range of 10 Å to 500 Å, distances in a range of 10 Å to 100 Å, distances in a range of 100 Å to 500 Å, and distances greater than 500 Å.

In the embodiments described above, the inflection is a squared corner (e.g., FIGS. 4A through 4D) or a rounded corner (FIGS. 4E through 4H). However, other inflections can be used. For example, inflections can include any non-planar feature, for example a bend, twist, fold, curve, turn, or other feature that results in a non-planar structure. Additional embodiments can include structures that might be considered a single continuous inflection, such as a dome-shaped structure, or multiple continuous inflections, such as a sine-wave-shaped structure. Also, while the inflected magnetoresistive structures described above have been disclosed herein having a single inflection, further embodiments can have any number of inflections. While the inflections illustrated have been shown between substantially orthogonal portions, inflections can join portions having any angle there between. While the embodiments described above include structures having an inflection interposing structure portions that are horizontal and vertical relative to the substrate, additional embodiments can include structures having one or more inflections interposing structure portions that are at any angle relative to the substrate, including embodiments where one or more inflections interpose structure portions that are both at a same angle or both at different angles relative to the substrate, for example where an inflection interposes two structure portions that are both vertical relative to the substrate or where an inflection interposes two structure portions that are both horizontal relative to the substrate.

The substrate (e.g., 61, 64, 66, 69, 73, 76, 79, and 82) can be formed of an insulating material that can include silicon (Si), oxygen (O), nitrogen (N), or combinations thereof. For example, the material used for the substrate can be SiO2. The thickness of the substrate can be, for example, any thickness greater than 1000 Å, for example thicknesses in a range of 1000 Å to 10000 Å, thicknesses in a range of 1000 Å to 5000 Å, thicknesses in a range of 5000 Å to 10000 Å, and thicknesses greater than 10000 Å.

The substrate (e.g., 61, 64, 66, 69, 73, 76, 79, and 82) can alternately be formed of a conducting material that can include silicon (Si), germanium (Ge), or any metal such as copper (Cu) or Aluminum (Al). For example, the material used for the substrate can be polycrystalline silicon (poly-Si), polycrystalline silicon-germanium (poly-SiGe), metal, metal silicide, metal nitride, metal oxide, or combinations thereof.

The MR structure (e.g., 60, 63, 67, 70, 72, 75, 78, and 81) can be an MTJ structure. Examples of MTJ structures that can be used as the MR structures in the above embodiments are shown in FIGS. 5A-5D. Also, although not shown, semiconductor devices and other layers may be formed within or over the substrate (e.g., 61, 64, 66, 69, 73, 76, 79, and 82). For example, logic transistors may be formed in the substrate using conventional methods.

Figure 5A:
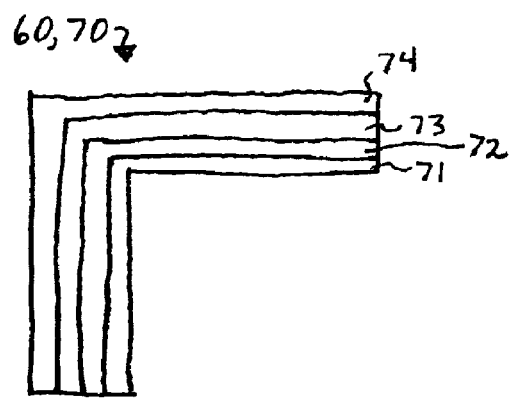
FIGS. 5A through 5D show examples of layers of the inflected magnetoresistive structures shown in FIGS. 4A through 4H.

FIG. 5A shows an example of an MTJ structure that can be used, for example, as MR structure 60 in FIG. 4A or as MR structure 70 in FIG. 4D. The MTJ structure includes an antiferromagnetic pinning layer 71, a ferromagnetic pinned layer 72, a nonmagnetic spacer layer 73, and a ferromagnetic free layer 74. Alternately, the order of the layers can be reversed, such that the MTJ structure includes a ferromagnetic free layer 71, a nonmagnetic spacer layer 72, a ferromagnetic pinned layer 73, and an antiferromagnetic pinning layer 74.

Figure 5B:
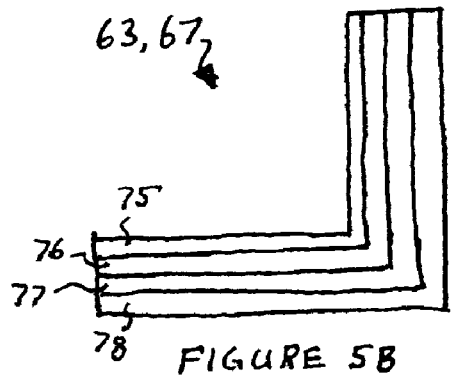

FIG. 5B shows an example of an MTJ structure that can be used, for example, as MR structure 63 in FIG. 4B or as MR structure 67 in FIG. 4C. The MTJ structure includes an antiferromagnetic pinning layer 75, a ferromagnetic pinned layer 76, a nonmagnetic spacer layer 77, and a ferromagnetic free layer 78. Alternately, the order of the layers can be reversed, such that the MTJ structure includes a ferromagnetic free layer 75, a nonmagnetic spacer layer 76, a ferromagnetic pinned layer 77, and an antiferromagnetic pinning layer 78.

Figure 5C:
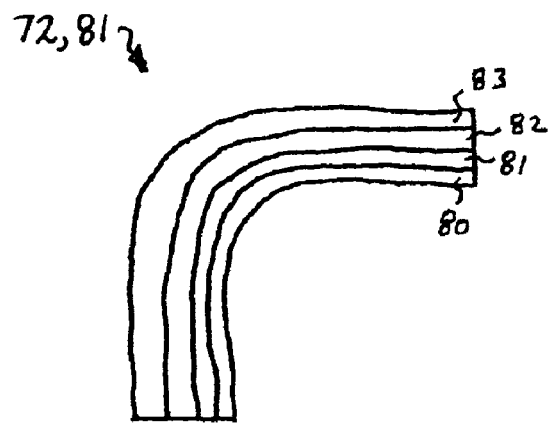

FIG. 5C shows an example of an MTJ structure that can be used, for example, as MR structure 72 in FIG. 4E or as MR structure 81 in FIG. 4H. The MTJ structure includes an antiferromagnetic pinning layer 80, a ferromagnetic pinned layer 81, a nonmagnetic spacer layer 82, and a ferromagnetic free layer 83. Alternately, the order of the layers can be reversed, such that the MTJ structure includes a ferromagnetic free layer 80, a nonmagnetic spacer layer 81, a ferromagnetic pinned layer 82, and an antiferromagnetic pinning layer 83.

Figure 5D:
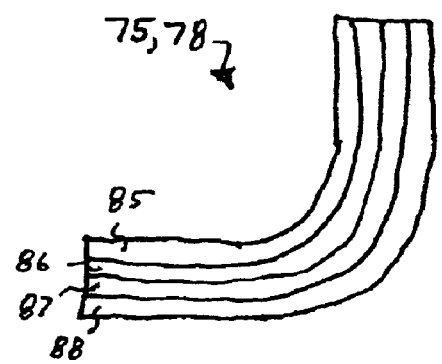

FIG. 5D shows an example of an MTJ structure that can be used, for example, as MR structure 75 in FIG. 4F or as MR structure 78 in FIG. 4G. The MTJ structure includes an antiferromagnetic pinning layer 85, a ferromagnetic pinned layer 86, a nonmagnetic spacer layer 87, and a ferromagnetic free layer 88. Alternately, the order of the layers can be reversed, such that the MTJ structure includes a ferromagnetic free layer 85, a nonmagnetic spacer layer 86, a ferromagnetic pinned layer 87, and an antiferromagnetic pinning layer 88.

The ferromagnetic layers, including free and pinned ferromagnetic layers, can be constructed of a ferromagnetic material that includes iron (Fe), cobalt (Co), nickel (Ni) or combinations thereof. For example, the material used for the ferromagnetic layers can be cobalt-iron or nickel-cobalt-iron. The antiferromagnetic pinning layer can be constructed of an antiferromagnetic material, for example platinum manganese or iron manganese. The spacer layer can be a tunnel barrier formed of an insulating material, for example aluminum oxide, magnesium oxide, or tantalum oxide. The spacer layer can be formed to have a thickness of less than or equal to 20 Å, for example in a range of 10 Å to 20 Å, or otherwise thin enough to allow the transfer (tunneling) of spin-aligned electrons when the magnetic moments of the ferromagnetic free layer and the ferromagnetic pinned layer are parallel, while impeding tunneling when the magnetic moments of the ferromagnetic free layer and the ferromagnetic pinned layer are antiparallel. While the embodiments shown in FIGS. 5A through 5D show the MTJ layers as all extending across the entirety of the structure, additional embodiments can have one or more layers that only extend for a portion or portions of the entirety of the structure.

Figure 6A:
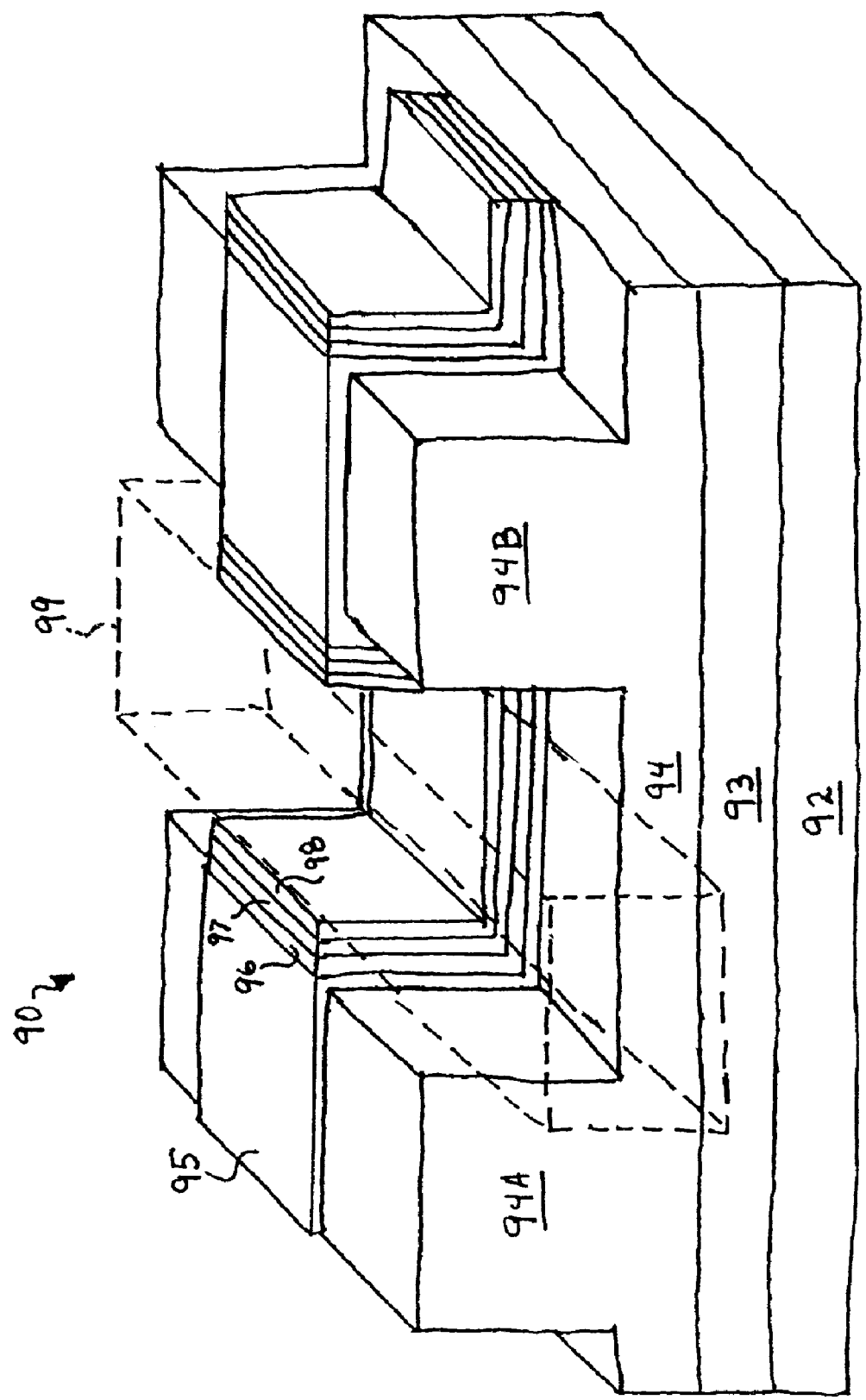
FIG. 6A shows a perspective view of a first embodiment of memory cell having an inflected MR structure.

Turning now to FIG. 6A, an embodiment of a memory cell having an inflected MR structure will be described. FIG. 6A shows a perspective view of an MRAM memory cell 90. The MRAM memory cell 90 is suitable for use with a 1T1MTJ (1-transistor, 1-magnetic tunnel junction) array architecture, shown in FIG. 7 and described below, but can alternately be used with other array architectures.

The MRAM memory cell 90 comprises a substrate 92. The substrate 92 can be a semiconductor substrate comprising silicon, germanium, and/or carbon. For example, the substrate 92 can be formed of silicon germanium or gallium arsenide. The substrate 92 can also be a silicon-on-insulator (SOI) semiconductor structure. A CMOS layer 93 is formed on the substrate 92. The CMOS layer 93 can include semiconductor devices, for example, logic transistors of the MRAM array, formed according to conventional methods. A dielectric layer 94 is formed over the CMOS layer 93. The dielectric layer 94 is formed into a series of dielectric steps 94A and 94B. The steps 94A and 94B can have, for example, a step height in a range of 200 nm to 1200 nm, or other heights can be used. A bit line (BL) 95 is formed over the dielectric layer 94. The bit line 95 is a conductive line, and thus can be formed of a conductive material that includes a metal, a metal silicide, a metal oxide, poly-Si, poly-SiGe, or a combination thereof. For example, the bit line 95 can be formed of copper (Cu) or aluminum (Al).

An inflected MTJ structure 96 is formed over the bit line 95. To be specific, the inflected MTJ structure 96 is formed in a trench between the dielectric steps 94A and 94B. The inflected MTJ structure 96 extends down a side of the dielectric step 94A, across the dielectric layer 94 between the dielectric steps 94A and 94B, and down a side of the dielectric step 94B. The inflected MTJ structure 96 thus includes two inflections, a first inflection (106 in FIG. 6B) where it is bent between the side of the step 94A and the top of the dielectric surface 94, and a second inflection (108 in FIG. 6B) where it is bent between the side of the step 94B and the top of the dielectric surface 94.

Figure 6B:
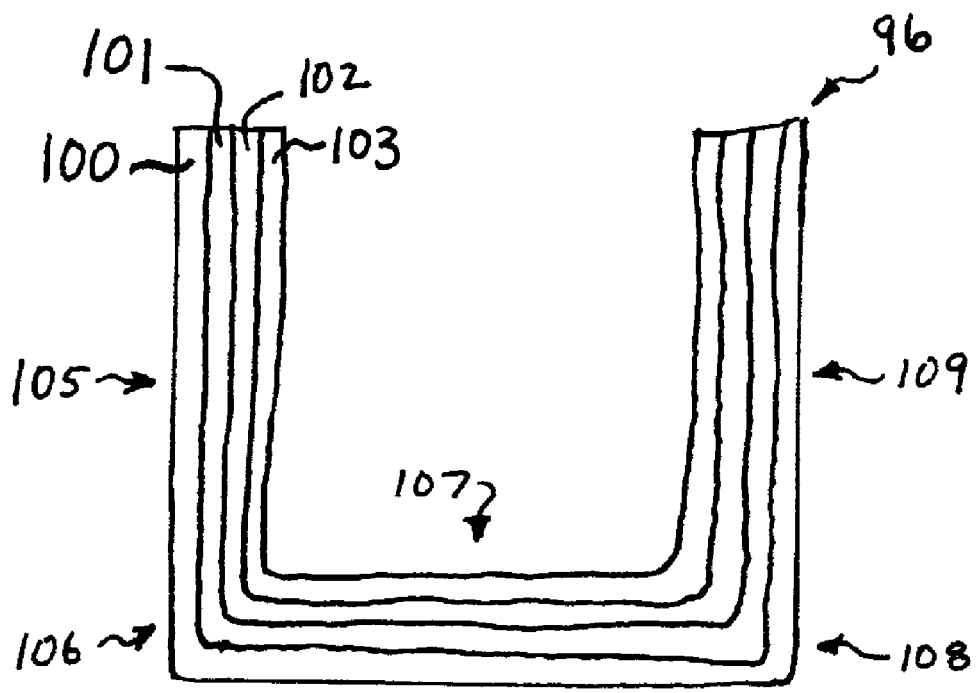
FIG. 6B shows an example of layers that can be included in the inflected magnetoresistive structure shown in FIG. 6A.

FIG. 6B shows an enlarged view of an embodiment of the inflected MTJ structure 96, including a view of layers of the MTJ structure 96. In the embodiment shown in FIG. 6B, the MTJ structure 96 includes a ferromagnetic free layer 100, a nonmagnetic spacer 101, a ferromagnetic pinned layer 102, and an antiferromagnetic pinning layer 103. Each of the layers 100, 101, 102, and 103 extends along a first vertical portion 105 that is substantially vertical relative to the substrate 92, through a first inflection 106, across a horizontal portion 107 that is substantially horizontal relative to the substrate 92, through a second inflection 108, and along a second vertical portion 109 that is substantially vertical relative to the substrate 92. Note that in some embodiments, the vertical portions 105 and 109 can be non-orthogonal to the horizontal portion 107. Also, note that in some embodiments, the inflections 106 and 108 can be more rounded as shown in FIGS. 4E-4H.

Turning back now to FIG. 6A, an electrode 97 is formed over the inflected MTJ structure 96. The electrode 97 is a conductive line, and thus can be formed of a conductive material such as a metal, a metal silicide, a metal oxide, poly-Si, poly-SiGe, or combinations thereof. For example, the electrode 97 can be formed of copper (Cu) or aluminum (Al). Next, an insulator 98 is formed over the electrode 97. The insulator 98 can be formed of a dielectric material, for example a silicon oxide. Finally, a program line 99, shown in phantom for purposes of clarity, is formed over the insulator 98. The program line 99 can extend somewhat orthogonally to the bit line 95. The program line 99 is a conductive line, and thus can be formed of a conductive material that includes a metal, a metal silicide, a metal oxide, poly-Si, poly-SiGe, or a combination thereof. For example, the program line 99 can be formed of copper (Cu) or aluminum (Al).

Figure 1:
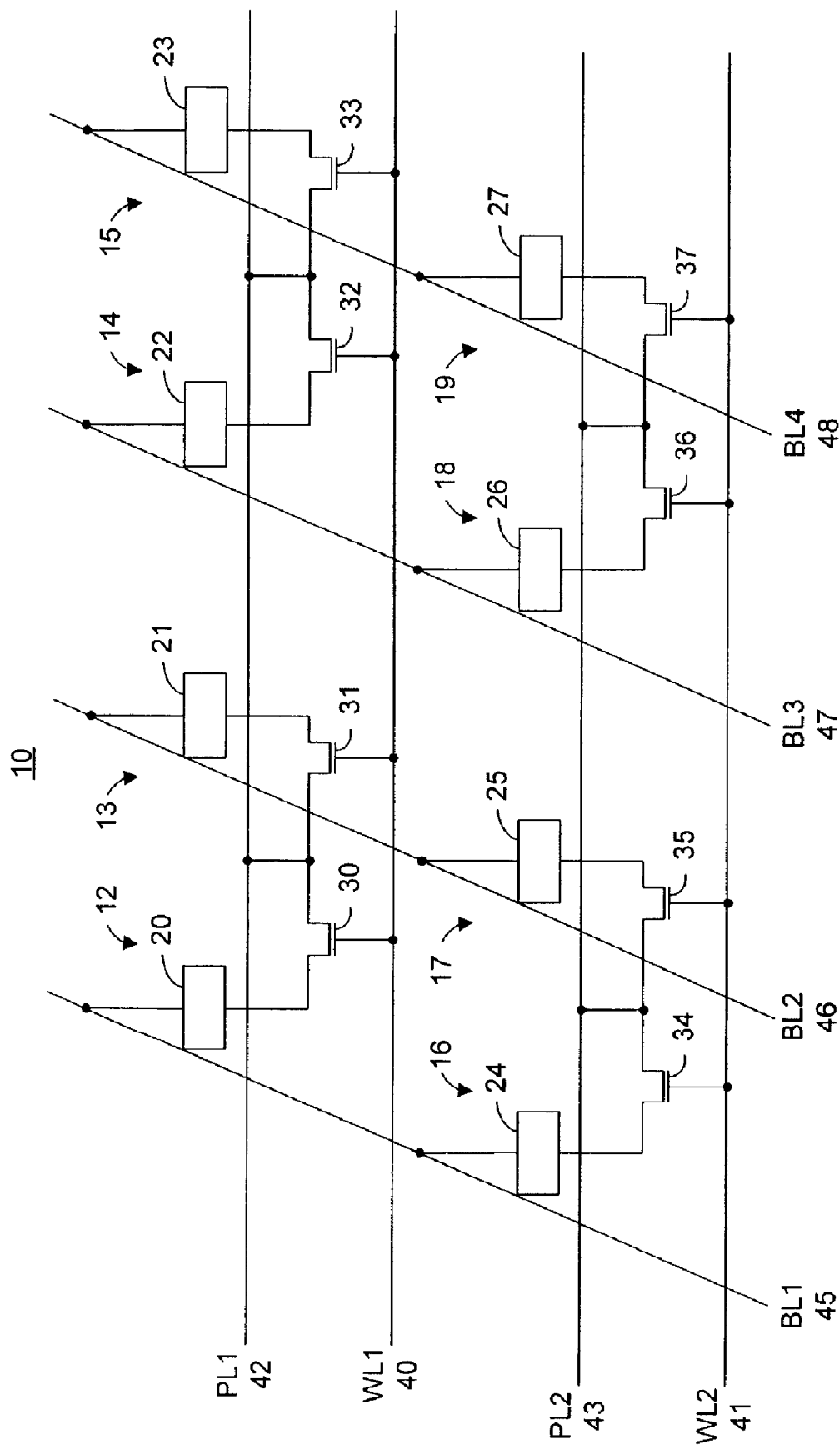
FIG. 1 shows a schematic diagram of a portion of an MRAM array.
Figure 2:
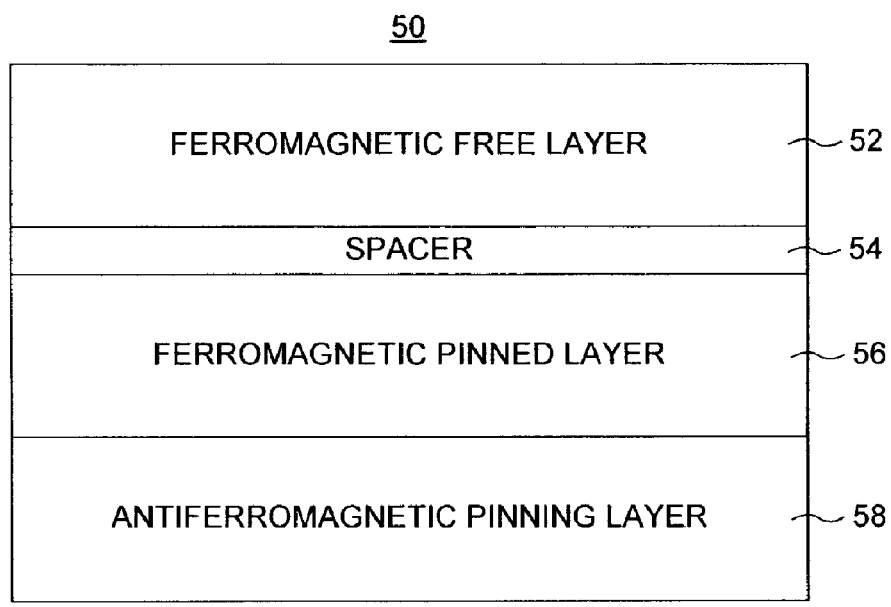
FIG. 2 shows a schematic block diagram of a typical MTJ structure.
Figure 7:
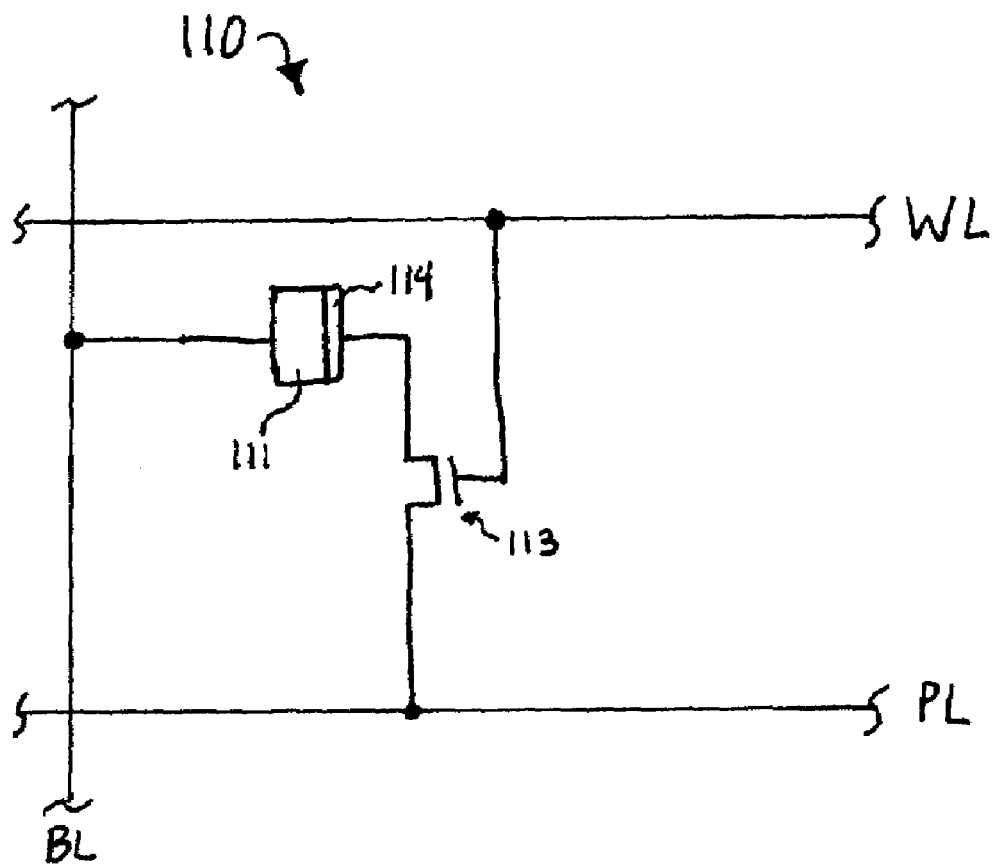
FIG. 7 shows a schematic view of a portion of an MRAM array having a 1M1MTJ architecture.

As mentioned above, the MRAM memory cell 90 can be used in a 1T1MJT MRAM array as shown in FIG. 7. FIG. 7 shows a schematic view of a portion 110 of a 1T1MTJ MRAM array. An actual array can extend in a series of rows and columns (e.g., as shown in FIG. 1). As shown in FIG. 7, an MTJ structure 111 is connected at one end to a bit line BL and at another end to a drain of a transistor 113 via an electrode 114. The source of the transistor 113 is connected to a program line PL, and the gate of the transistor 113 is connected to a word line WL.

Figure 3:
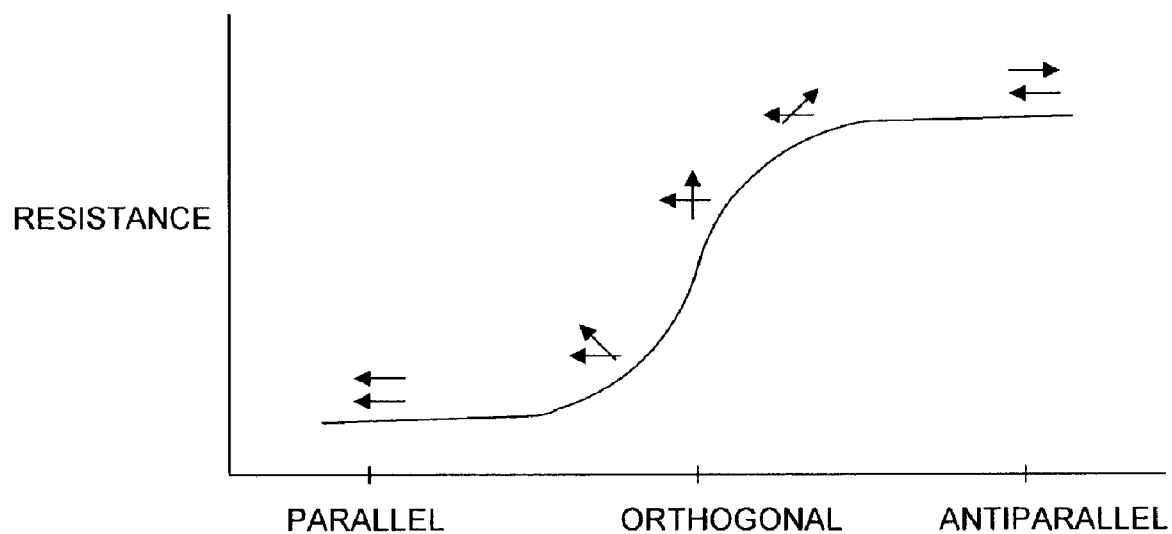
FIG. 3 shows a graph of the relationship between resistance and the relative magnetic orientations of the free and pinned layers in the MTJ shown in FIG. 2.

The portion 110 of the array operates as follows. For a read operation, the word line WL is activated (e.g., WL=VDD) to turn on the transistor 113, a read current IR is passed to the MTJ structure 111 via the bit line BL, and the program line PL is brought to signal ground. The resistance (e.g., from the ferromagnetic free layer to the ferromagnetic pinned layer or to the antiferromagnetic pinning layer) of the MTJ structure 111 will be approximately equal to one of two resistance values, depending on the relative magnetic orientations of the free and pinned ferromagnetic layers (e.g., see FIG. 3). Thus, the state of the MTJ structure 111 can be detected by sensing the amount of current passing to the program line PL through the MTJ structure 111 or by sensing the voltage drop from the bit line BL to the program line PL across the MTJ structure 111.

For a write operation, a first write current IW1 is passed through the program line PL, a second write current IW2 is passed through the bit line BL, and the word line WL is grounded to turn off the transistor 113. Note that the MTJ structure 111 is positioned between the program line PL and the bit line BL at an intersection of the two orthogonal lines, for example as shown in FIG. 6A. The currents IW1 and IW2 generate magnetic fields for changing the magnetic orientation of the free layer in the MTJ structure 111. The levels of the currents IW1 and IW2 are selected such that neither current alone can generate a magnetic field strong enough to change the magnetic orientation of the free layer, but when combined the fields can change the magnetic orientation of the free layer. The direction of the current flowing through the bit line BL is selected based on whether a "1" or a "0" is being written. For example, in FIG. 7, current flowing down might be used to write a "0" and current flowing up used to write a "1".

Components shown in FIGS. 6A and 6B can be used as components of the portion 110 of the 1T1MTJ array in FIG. 7 as follows: the MTJ structure 96 can be used as the MTJ structure M, the electrode 97 can be used as the electrode E, the bit line 95 can be used as the bit line BL, the program line 99 can be used as the program line PL, and the word line WL and the transistor T can be formed in the CMOS layer 93. A via or other conductive structure not shown in FIG. 6A can be used to connect the electrode 97 to a transistor in the CMOS layer 93.

Figure 8B:
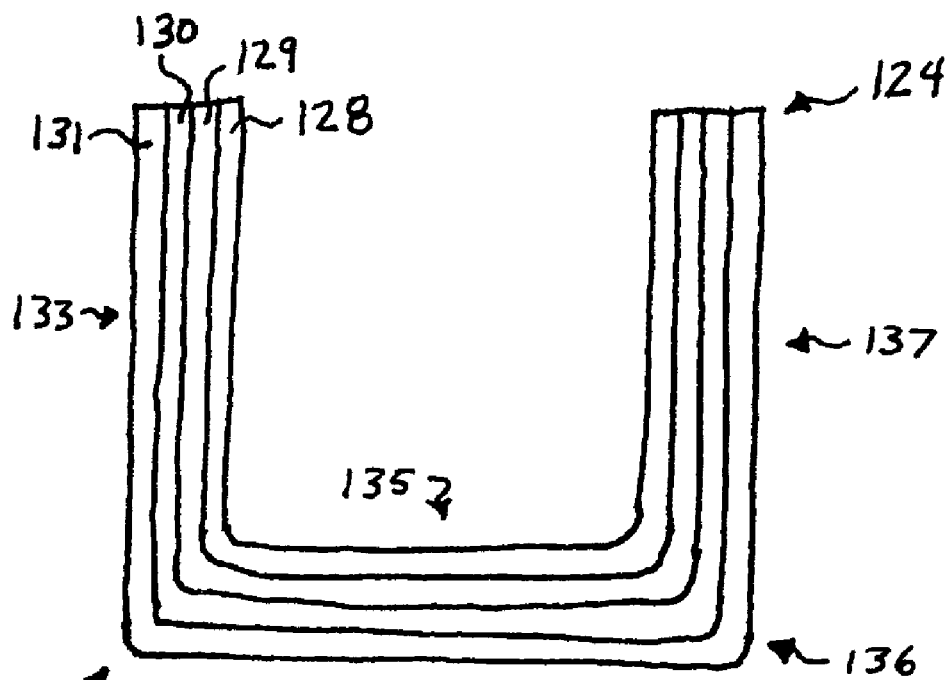
FIG. 8B shows samples of layers that can be included in the inflected magnetoresistive structure shown in FIG. 8A.
Figure 8A:
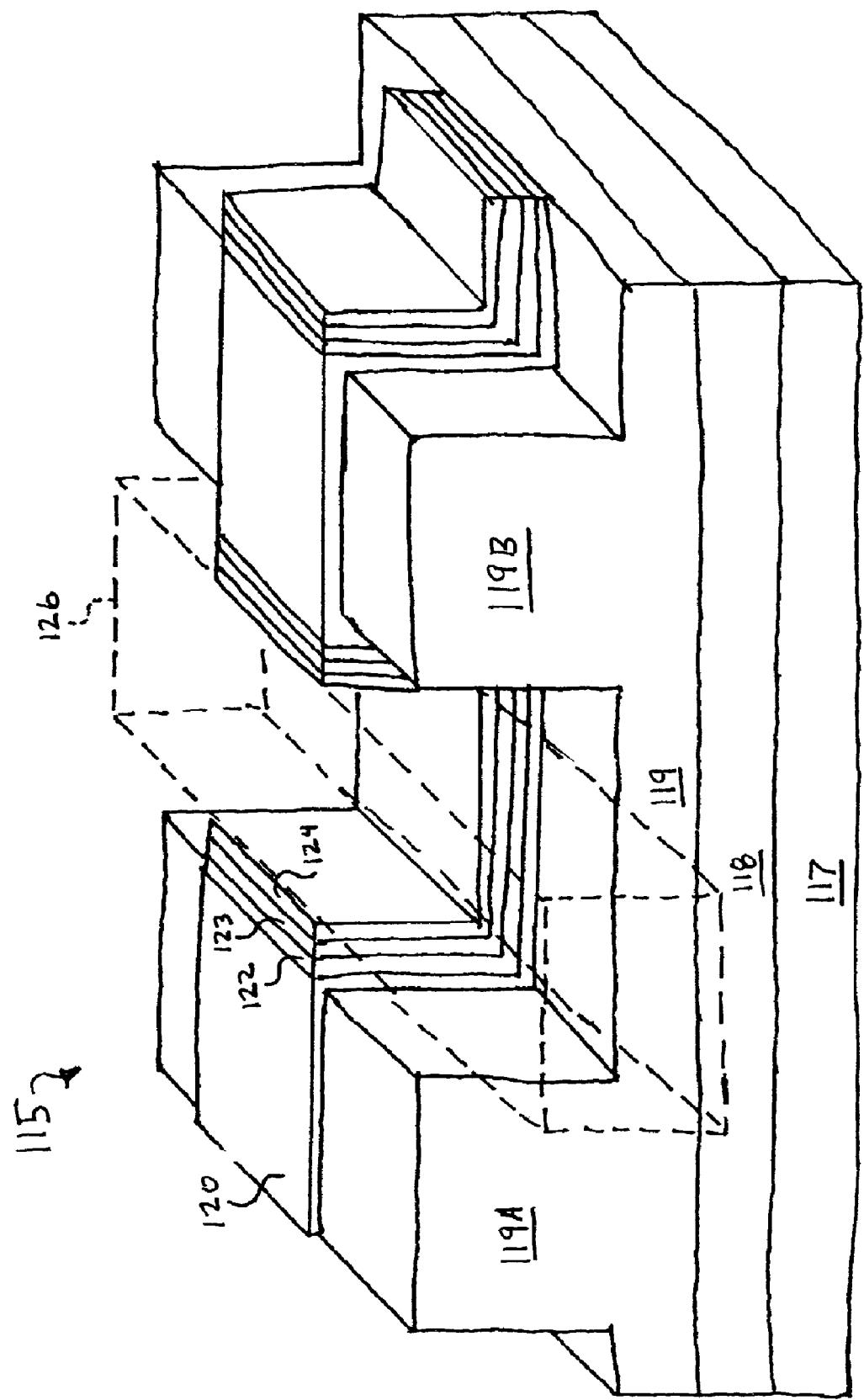
FIG. 8A shows a perspective view of a second embodiment of memory cell having an inflected MR structure.

Turning next to FIG. 8A, an alternate embodiment of a memory cell having an inflected MR structure will be described. FIG. 8A shows a perspective view of an MRAM memory cell 115. The MRAM memory cell 115 is suitable for use with a 1T1MTJ (1-transistor, 1-magnetic tunnel junction) array architecture as shown in FIG. 7, but can alternately be used with other array architectures.

The MRAM memory cell 115 comprises a substrate 117. The substrate 117 can be a semiconductor substrate comprising silicon, germanium, and/or carbon. For example, the substrate 117 can be formed of silicon germanium or gallium arsenide. The substrate 117 can also be a silicon-on-insulator (SOI) semiconductor structure. A CMOS layer 118 is formed on the substrate 117. The CMOS layer 117 can include semiconductor devices, for example, logic transistors of the MRAM array, formed according to conventional methods. A dielectric layer 119 is formed over the CMOS layer 118. The dielectric layer 119 is formed into a series of dielectric steps 119A and 119B. The steps 119A and 119B can have, for example, a step height in a range of 200 nm to 1200 nm, or other heights can be used.

A program line (PL) 120 is formed over the dielectric layer 119, extending across the dielectric steps 119A and 119B. The program line 120 extends in a direction somewhat orthogonal to the longitudinal direction of the dielectric steps 119A and 119B. The program line 120 is a conductive line, and thus can be formed of a conductive material that includes a metal, a metal silicide, a metal oxide, poly-Si, poly-SiGe, or a combination thereof. For example, the program line 120 can be formed of copper (Cu) or aluminum (Al).

Next, an insulator 122 is formed over the program line 120. More specifically, the insulator 122 is formed over the portion of the program line along the sides of the dielectric steps 119A and 119B and across the dielectric layer 119 between the dielectric steps 119A and 119B. The insulator 122 can be formed of a dielectric material, for example a silicon oxide. An electrode 123 is formed over the insulator 122. The electrode 123 is a conductive line, and thus can be formed of a conductive material such as a metal, a metal silicide, a metal oxide, poly-Si, poly-SiGe, or combinations thereof. For example, the electrode 123 can be formed of copper (Cu) or aluminum (Al).

An inflected MTJ structure 124 is formed over the electrode 123. To be specific, the inflected MTJ structure 124 is formed in a trench between the dielectric steps 119A and 119B. The inflected MTJ structure 124 extends down a side of the dielectric step 119A, across the dielectric layer 119 between the dielectric steps 119A and 119B, and down a side of the dielectric step 119B. The inflected MTJ structure 124 thus includes two inflections, a first inflection (134 in FIG.

8B) where it is bent between the side of the step 119A and the top of the dielectric surface 119, and a second inflection (136 in FIG. 8B) where it is bent between the side of the step 119B and the top of the dielectric surface 119.

FIG. 8B shows an enlarged view of an embodiment of the inflected MTJ structure 124, including a view of layers of the MTJ structure 124. In the embodiment shown in FIG. 8B, the MTJ structure 124 includes ferromagnetic free layer 128, a nonmagnetic spacer 129, a ferromagnetic pinned layer 130, and an antiferromagnetic pinning layer 131. Each of the layers 128, 129, 130, and 131 extends along a first vertical portion 133 that is substantially vertical relative to the substrate 117, through a first inflection 134, across a horizontal portion 135 that is substantially horizontal relative to the substrate 117, through a second inflection 136, and along a second vertical portion 137 that is substantially vertical relative to the substrate 117. Note that in some embodiments, the vertical portions 133 and 137 can be non-orthogonal to the horizontal portion 135. Also, note that in some embodiments, the inflections 134 and 136 can be more rounded as shown in FIGS. 4E-4H.

Turning back now to FIG. 8A, a bit line 126, shown in phantom for purposes of clarity, is formed over the MTJ structure 124. The bit line 126 can extend somewhat orthogonally to the program line 120. The bit line 126 is a conductive line, and thus can be formed of a conductive material that includes a metal, a metal silicide, a metal oxide, poly-Si, poly-SiGe, or a combination thereof. For example, the bit line 126 can be formed of copper (Cu) or aluminum (Al).

As mentioned above, the MRAM memory cell 115 can be used in the 1T1MJT array as shown in FIG. 7. Components shown in FIGS. 8A and 8B can be used as components of the portion 110 of the 1T1MTJ array in FIG. 7 as follows: the MTJ structure 124 can be used as the MTJ structure M, the electrode 123 can be used as the electrode E, the bit line 126 can be used as the bit line BL, the program line 120 can be used as the program line PL, and the word line WL and the transistor T can be formed in the CMOS layer 118. A via or other conductive structure not shown in FIG. 8A can be used to connect the electrode 123 to a transistor in the CMOS layer 118.

Figure 9A:
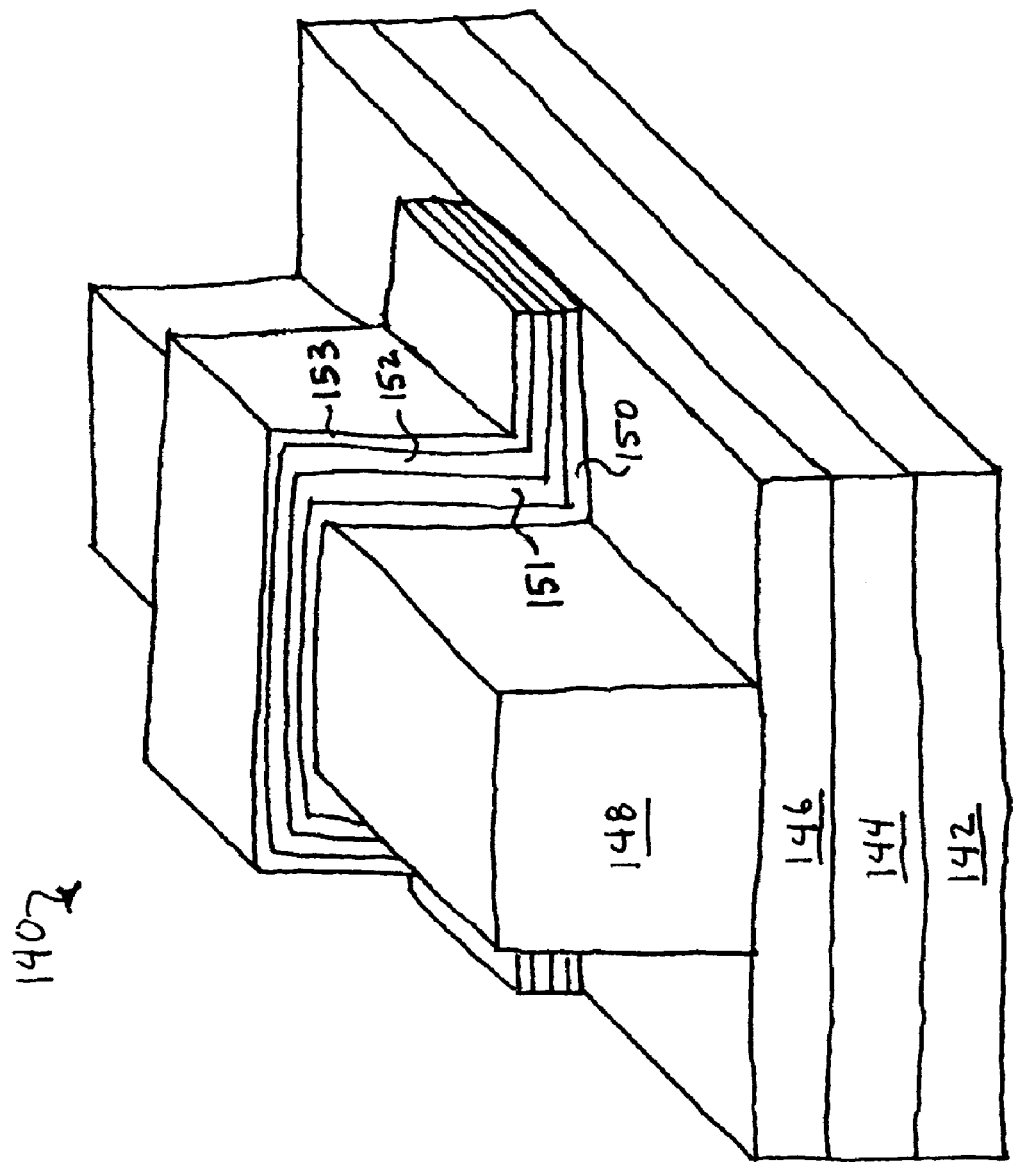
FIG. 9A shows a perspective view of a third embodiment of memory cell having an inflected MR structure.

Turning next to FIG. 9A, another alternate embodiment of a memory cell having an inflected MR structure will be described. FIG. 9A shows a perspective view of an MRAM memory cell 140. The MRAM memory cell 140 is suitable for use with a 1T1MTJ (1-transistor, 1-magnetic tunnel junction) array architecture as shown in FIG. 7, but can alternately be used with other array architectures.

The MRAM memory cell 140 comprises a substrate 142. The substrate 142 can be a semiconductor substrate comprising silicon, germanium, and/or carbon. For example, the substrate 142 can be formed of silicon germanium or gallium arsenide. The substrate 142 can also be a silicon-on-insulator (SOI) semiconductor structure. A CMOS layer 144 is formed on the substrate 142. The CMOS layer 144 can include semiconductor devices, for example, logic transistors of the MRAM array, formed according to conventional methods. A dielectric layer 146 is formed over the CMOS layer 144.

A bit line (BL) 148 is formed over the dielectric layer 146, extending in a longitudinal direction forming a step. The step formed by the bit line 148 can have, for example, a step height in a range of 200 nm to 1200 nm, or other heights can be used. The bit line 148 is a conductive line, and thus can be formed of a conductive material that includes a metal, a metal silicide, a metal oxide, poly-Si, poly-SiGe, or a combination thereof. For example, the program line 148 can be formed of copper (Cu) or aluminum (Al).

An inflected MTJ structure 150 is formed over the bit line 148. To be specific, the inflected MTJ structure 150 is formed across the step formed by the bit line 148. The inflected MTJ structure 150 extends up a first side of the bit line 148, across the top of the bit line 148, down a second side of the bit line 148. The inflected MTJ structure 150 thus includes two inflections, a first inflection (161 in FIG. 9B) where it is bent between the first side and the top of the bit line 148, and a second inflection (163 in FIG. 9B) where it is bent between the second side and the top of the bit line 148.

Figure 9B:
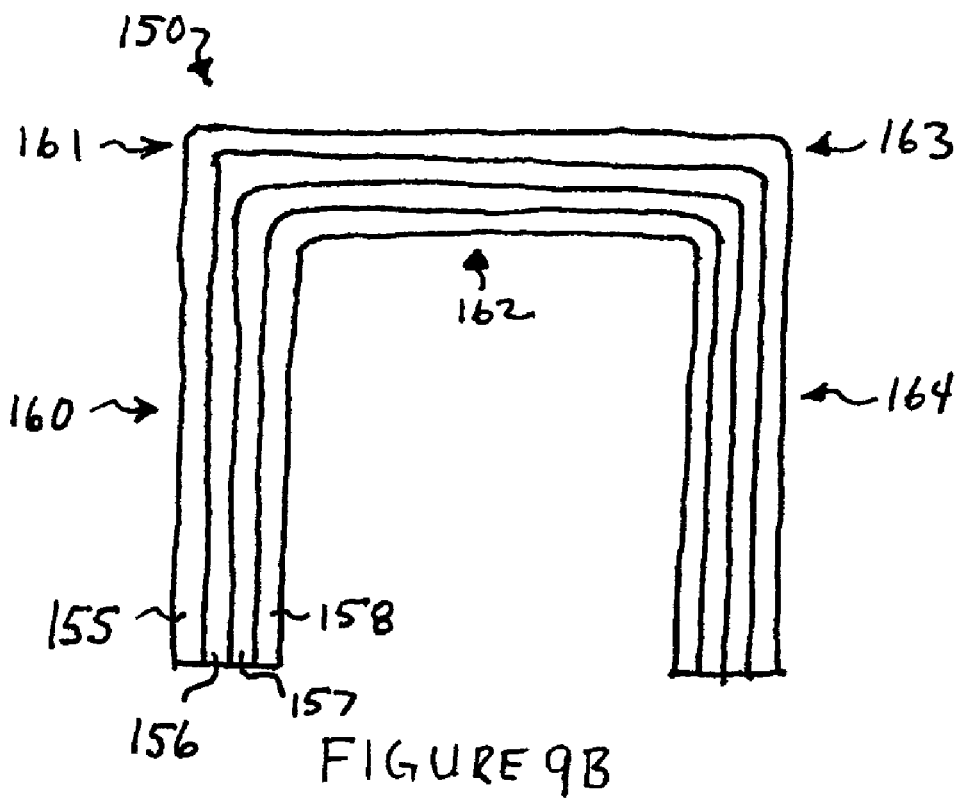
FIG. 9B shows an example of layers that can be included in the inflected magnetoresistive structure shown in FIG. 9A.

FIG. 9B shows an enlarged view of an embodiment of the inflected MTJ structure 150, including a view of layers of the MTJ structure 150. In the embodiment shown in FIG. 9B, the MTJ structure 150 includes an antiferromagnetic pinning layer 155, a ferromagnetic pinned layer 156, a nonmagnetic spacer 157, and a ferromagnetic free layer 158. Each of the layers 155, 156, 157, and 158 extends along a first vertical portion 160 that is substantially vertical relative to the substrate 142, through a first inflection 161, across a horizontal portion 162 that is substantially horizontal relative to the substrate 142, through a second inflection 163, and along a second vertical portion 164 that is substantially vertical relative to the substrate 142. Note that in some embodiments, the vertical portions 160 and 164 can be non-orthogonal to the horizontal portion 162. Also, note that in some embodiments, the inflections 161 and 163 can be more rounded as shown in FIGS. 4E-4H.

Turning back now to FIG. 9A, an electrode 151 is formed over the inflected MTJ structure 150. The electrode 151 is a conductive line, and thus can be formed of a conductive material such as a metal, a metal silicide, a metal oxide, poly-Si, poly-SiGe, or combinations thereof. For example, the electrode 151 can be formed of copper (Cu) or aluminum (Al). Next, an insulator 152 is formed over the electrode 151. The insulator 152 can be formed of a dielectric material, for example a silicon oxide. Finally, a program line 153 is formed over the insulator 152. The program line 153 can extend somewhat orthogonally to the bit line 148. The program line 153 is a conductive line, and thus can be formed of a conductive material that includes a metal, a metal silicide, a metal oxide, poly-Si, poly-SiGe, or a combination thereof. For example, the program line 153 can be formed of copper (Cu) or aluminum (Al).

As mentioned above, the MRAM memory cell 140 can be used in a 1T1MJT array architecture, for example as shown in FIG. 7. Components shown in FIGS. 9A and 9B can be used as components of the portion 110 of the 1T1MTJ array in FIG. 7 as follows: the MTJ structure 150 can be used as the MTJ structure M, the electrode 151 can be used as the electrode E, the bit line 148 can be used as the bit line BL, the program line 153 can be used as the program line PL, and the word line WL and the transistor T can be formed in the CMOS layer 144. A via or other conductive structure not shown in FIG. 9A can be used to connect the electrode 151 to a transistor in the CMOS layer 144.

Turning next to FIG. 10A, another alternate embodiment of a memory cell having an inflected MR structure will be described. FIG. 10A shows a perspective view of an MRAM memory cell 170. The MRAM memory cell 170 is suitable for use with a 1T1MTJ (1-transistor, 1-magnetic tunnel junction) array architecture as shown in FIG. 7, but can alternately be used with other array architectures.

The MRAM memory cell 170 comprises a substrate 172. The substrate 172 can be a semiconductor substrate comprising silicon, germanium, and/or carbon. For example, the substrate 172 can be formed of silicon germanium or gallium arsenide. The substrate 172 can also be a silicon-on-insulator (SOI) semiconductor structure. A CMOS layer 173 is formed on the substrate 172. The CMOS layer 173 can include semiconductor devices, for example, logic transistors of the MRAM array, formed according to conventional methods. A dielectric layer 174 is formed over the CMOS layer 173.

A program line (PL) 176 is formed over the dielectric layer 174, extending in a longitudinal direction forming a step. The step formed by the program line 176 can have, for example, a step height in a range of 200 nm to 1200 nm, or other heights can be used. The program line 176 is a conductive line, and thus can be formed of a conductive material that includes a metal, a metal silicide, a metal oxide, poly-Si, poly-SiGe, or a combination thereof. For example, the program line 176 can be formed of copper (Cu) or aluminum (Al).

Next, an insulator 178 is formed over the program line 176. More specifically, the insulator 178 is formed across the step formed by the program line 176. The insulator 178 extends up a first side of the program line 176, across the top of the program line 176, and down a second side of the program line 176. The insulator 178 can be formed of a dielectric material, for example a silicon oxide. An electrode 179 is formed over the insulator 178. The electrode 179 is a conductive line, and thus can be formed of a conductive material such as a metal, a metal silicide, a metal oxide, poly-Si, poly-SiGe, or combinations thereof. For example, the electrode 179 can be formed of copper (Cu) or aluminum (Al).

An inflected MTJ structure 180 is formed over the electrode 179. To be specific, the inflected MTJ structure 180 follows substantially the same path as the insulator 178, extending up the first side of the program line 176, across the top of the program line 176, and down the second side of the program line 176. The inflected MTJ structure 180 thus includes two inflections, a first inflection (189 in FIG. 10B) where it is bent between the first side and the top of the program line 176, and a second inflection (191 in FIG. 10B) where it is bent between the second side and the top of the program line 176.

Figure 10B:
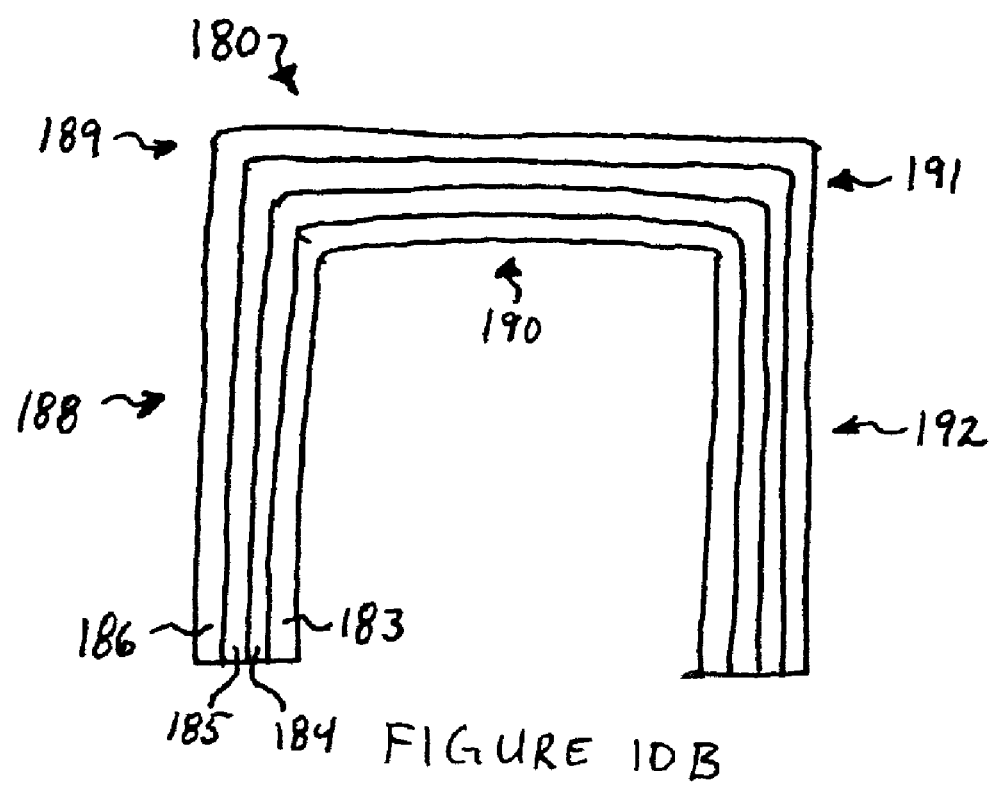
FIG. 10B shows an example of layers that can be included in the inflected magnetoresistive structure shown in FIG. 10A.

FIG. 10B shows an enlarged view of an embodiment of the inflected MTJ structure 180, including a view of layers of the MTJ structure 180. In the embodiment shown in FIG. 10B, the MTJ structure 180 includes an antiferromagnetic pinning layer 183, a ferromagnetic pinned layer 184, a nonmagnetic spacer 185, and a ferromagnetic free layer 186. Each of the layers 183, 184, 185, and 186 extends along a first vertical portion 188 that is substantially vertical relative to the substrate 172, through a first inflection 189, across a horizontal portion 190 that is substantially horizontal relative to the substrate 172, through a second inflection 191, and along a second vertical portion 192 that is substantially vertical relative to the substrate 172. Note that in some embodiments, the vertical portions 188 and 192 can be non-orthogonal to the horizontal portion 190. Also, note that in some embodiments, the inflections 189 and 191 can be more rounded as shown in FIGS. 4E-4H.

Turning back now to FIG. 10A, a bit line 181 is formed over the MTJ structure 180. The bit line 181 can extend somewhat orthogonally to the program line 176. The bit line 181 is a conductive line, and thus can be formed of a conductive material that includes a metal, a metal silicide, a metal oxide, poly-Si, poly-SiGe, or a combination thereof. For example, the bit line 181 can be formed of copper (Cu) or aluminum (Al).

As mentioned above, the MRAM memory cell 170 can be used in the 1T1MJT array as shown in FIG. 7. Components shown in FIGS. 10A and 10B can be used as components of the portion 110 of the 1T1MTJ array in FIG. 7 as follows: the MTJ structure 180 can be used as the MTJ structure M, the electrode 179 can be used as the electrode E, the bit line 181 can be used as the bit line BL, the program line 176 can be used as the program line PL, and the word line WL and the transistor T can be formed in the CMOS layer 173. A via or other conductive structure not shown in FIG. 10A can be used to connect the electrode 179 to a transistor in the CMOS layer 173.

Processes for forming memory cells that include an inflected MR structure will now be described in connection with FIGS. 11-14.

Figure 11A:
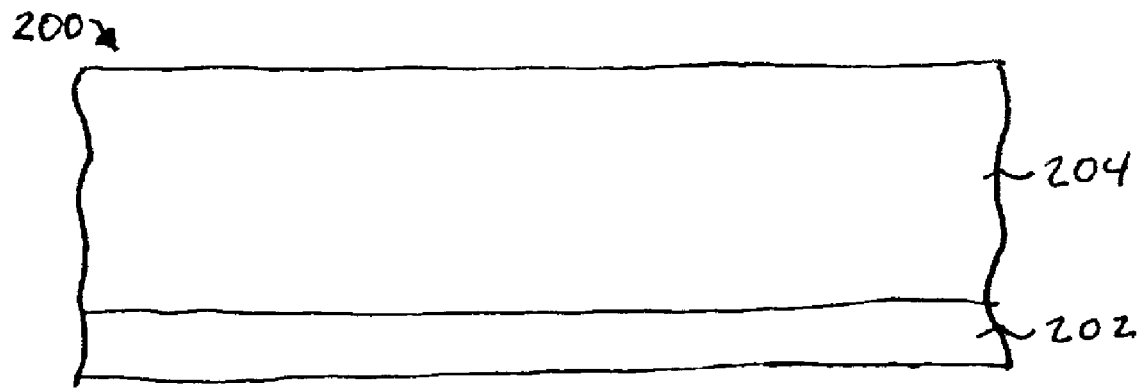
FIGS. 11A through 11F show a first embodiment of a process for fabricating a memory cell having an inflected magnetoresistive structure.

FIG. 11A illustrates in a cross-sectional view a substrate 202 on which a magnetic random access memory (MRAM) device 200 is formed. Although not shown, semiconductor devices and other layers may be formed within or over the substrate 202. For example, logic transistors may be formed in the substrate 202 using conventional methods. A first dielectric layer 204 is formed over the substrate 202, for example by chemical vapor deposition (CVD), physical vapor deposition (PVD), thermal growth, or combinations thereof.

Figure 11B:
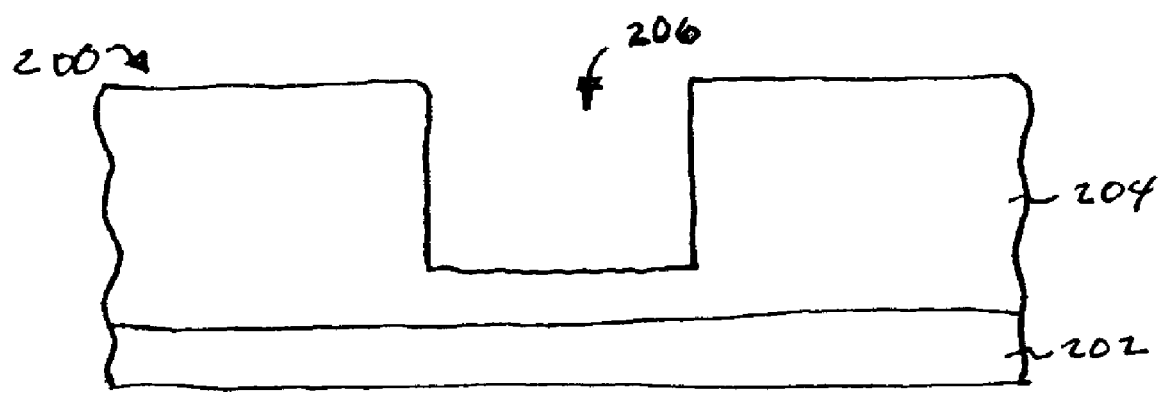
Figure 11C:
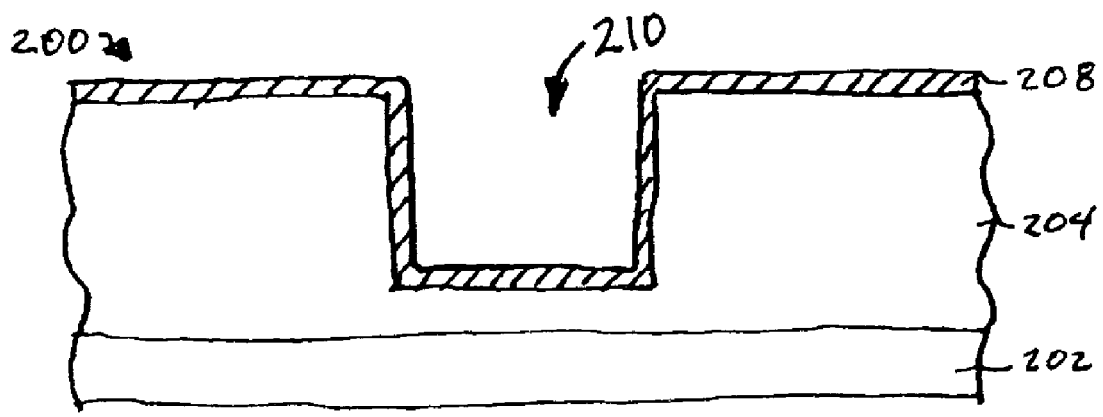

As shown in FIG. 11B, the first dielectric layer 204 is patterned, e.g., by photolithography and etching, to form an opening 206. Next, as shown in FIG. 11C, after forming the opening 206, a first metal layer 208 is deposited over the substrate 202. The first metal layer 208 can be deposited by any thin-film deposition technique, e.g., electroplating or sputtering. The first metal layer 208 is deposited along the walls of the opening 206 and over the exposed top surface of the first dielectric layer 204. The first metal layer 208 serves as a conducting line (e.g., bit line) of the MRAM device 200 and will be connected to periphery CMOS controlling transistors which regulate the reading and writing of the memory cells. Excess material of the first metal layer 208 can be removed, e.g., by photolithography and etching, to form an opening 210.

Figure 11D:
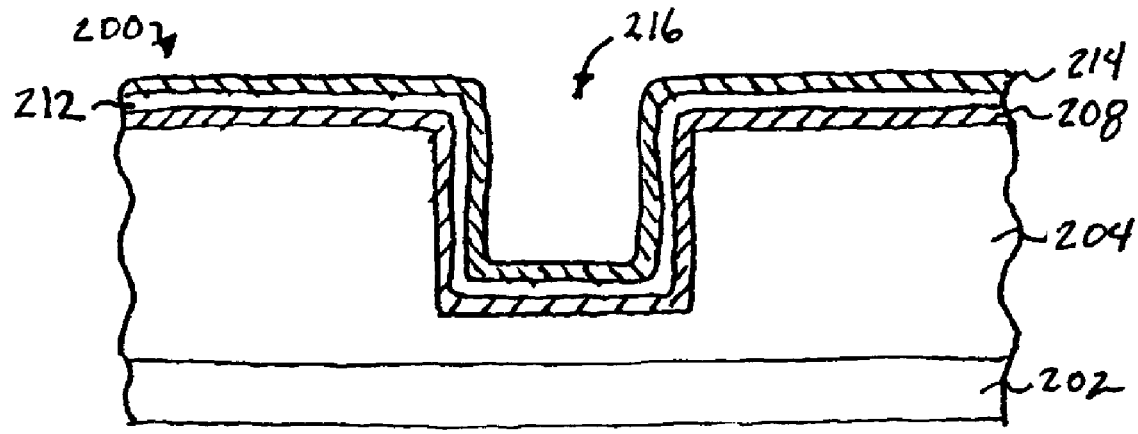

As shown in FIG. 11D, layers of an MTJ structure 212 are deposited over the first metal layer 208. More specifically, the MTJ structure 212 is deposited along the walls of the opening 210. The MTJ structure 212 can include a first ferromagnetic layer formed by thin-film deposition, a spacer layer of non-magnetic material formed over the first ferromagnetic layer by any oxidation technique, and a second ferromagnetic layer formed over the non-magnetic layer by thin-film deposition. The MTJ structure 212 can also include an antiferromagnetic layer formed over the second ferromagnetic layer for pinning the magnetization direction of the second ferromagnetic layer. After each layer of the MTJ structure 212 is formed, excess materials can be removed, e.g., by photolithography and etching. Next, an electrode 214 is deposited, e.g., by any thin-film deposition technique, over the MTJ structure 212. A via or other conductive structure (not shown) can be formed by known techniques to connect the electrode 214 to a semiconductor device within or over the substrate 202. After the electrode 214 is formed, excess materials can be removed, e.g., by photolithography and etching, to form an opening 216.

Figure 11E:
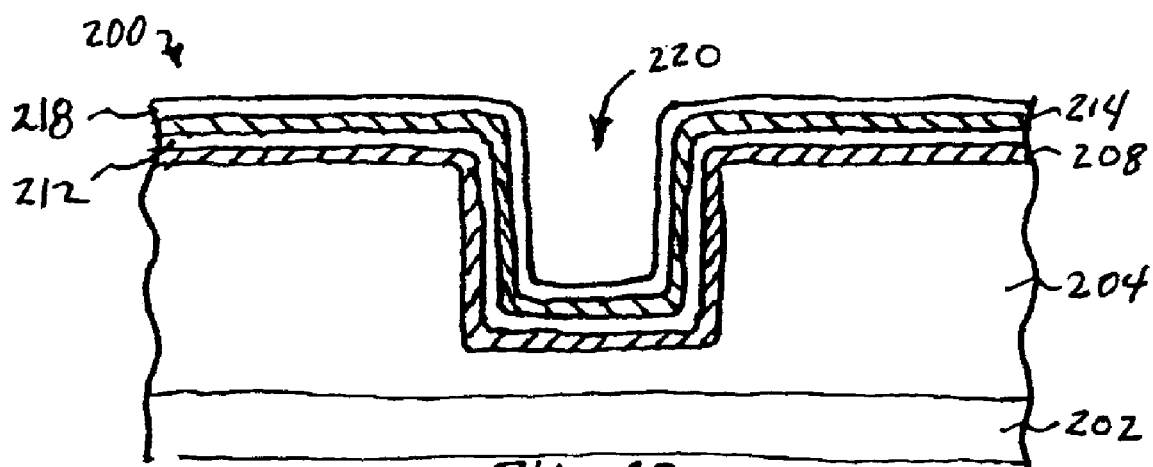

Next, as shown in FIG. 11E, a second dielectric layer (e.g., insulator) 218 is formed over the electrode 214 by any oxidation technique. After the second dielectric layer 218 is formed, excess materials can be removed, e.g., by photolithography and etching, to form an opening 220.

Figure 11F:
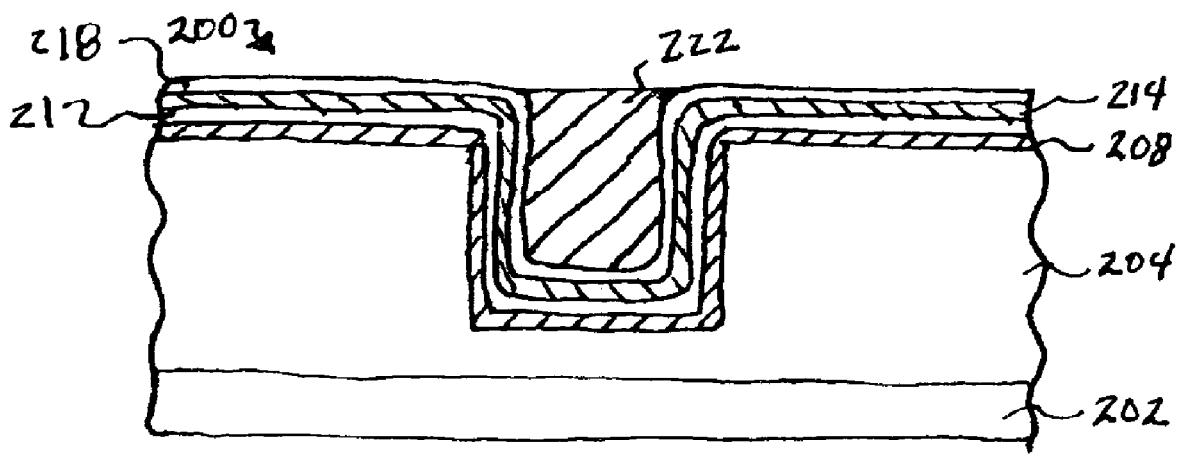

Next, as shown in FIG. 11F, a second metal layer 222 is deposited in the opening 220. The second metal layer 222 can be deposited by any thin-film deposition technique, e.g., electroplating or sputtering. The second metal layer 222 serves as a conducting line (e.g., program line) of the MRAM device 200 and will be connected to periphery CMOS controlling transistors which regulate the reading and writing of the memory cells. The MRAM device 200 can be planarized by an etch back or a chemical mechanical polishing (CMP) process, particularly in order to remove portions of the second metal layer 222 that are not within the opening 220.

Figure 12A:
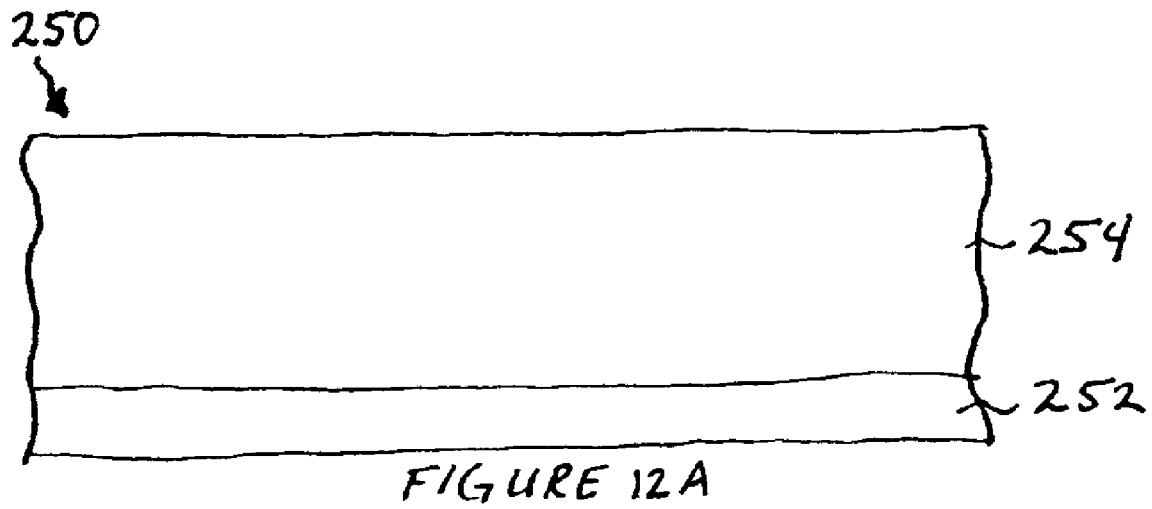
FIGS. 12A through 12F show a second embodiment of a process for fabricating a memory cell having an inflected magnetoresistive structure.

FIG. 12A illustrates in a cross-sectional view a substrate 252 on which a magnetic random access memory (MRAM) device 250 is formed. Although not shown, semiconductor devices and other layers may be formed within or over the substrate 252. For example, logic transistors may be formed in the substrate 252 using conventional methods. A first dielectric layer 254 is formed over the substrate 252 by chemical vapor deposition (CVD), physical vapor deposition (PVD), thermal growth, or combinations thereof.

Figure 12B:
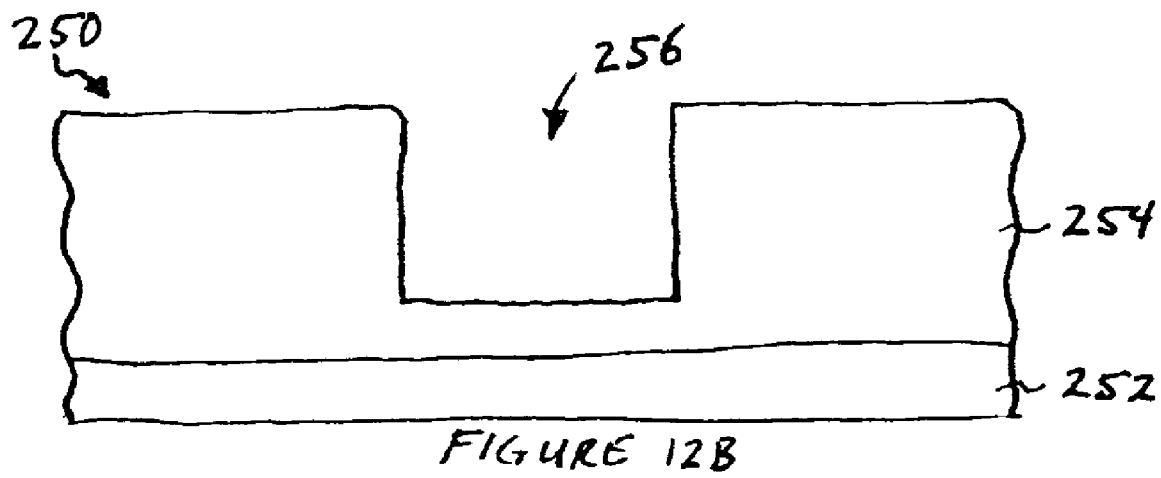
Figure 12C:
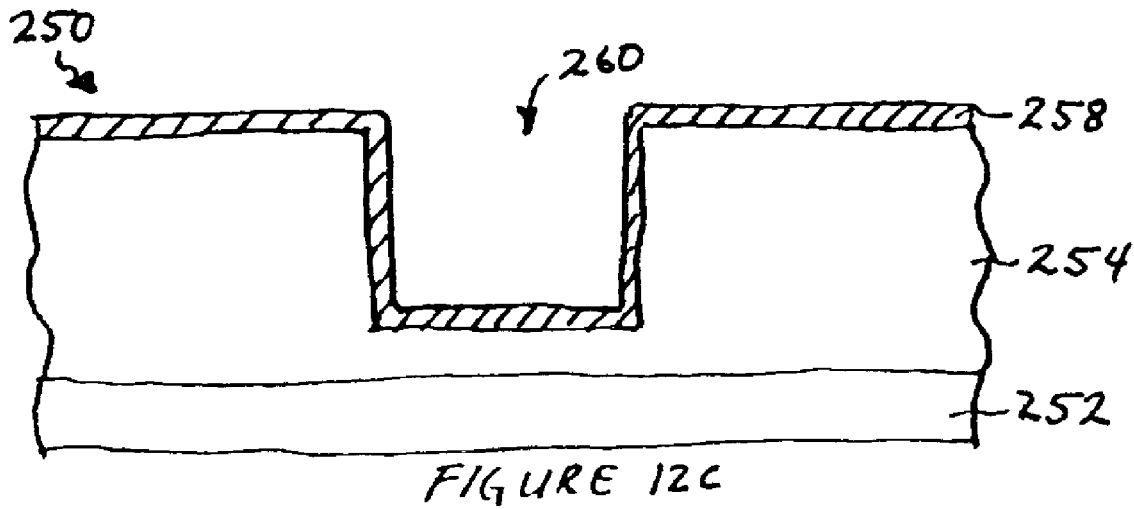

As shown in FIG. 12B, the first dielectric layer 254 is patterned, e.g., by photolithography and etching, to form an opening 256. Next, as shown in FIG. 12C, after forming the opening 256, a first metal layer 258 is deposited over the substrate 252. The first metal layer 258 can be deposited by any thin-film deposition technique, e.g., electroplating or sputtering. The first metal layer 258 is deposited along the walls of the opening 256 and over the exposed top surface of the first dielectric layer 254. The first metal layer 258 serves as a conducting line (e.g., program line) of the MRAM device 250 and will be connected to periphery CMOS controlling transistors which regulate the reading and writing of the memory cells. Excess material of the first metal layer 258 can be removed, e.g., by photolithography and etching, to form an opening 260.

Figure 12D:
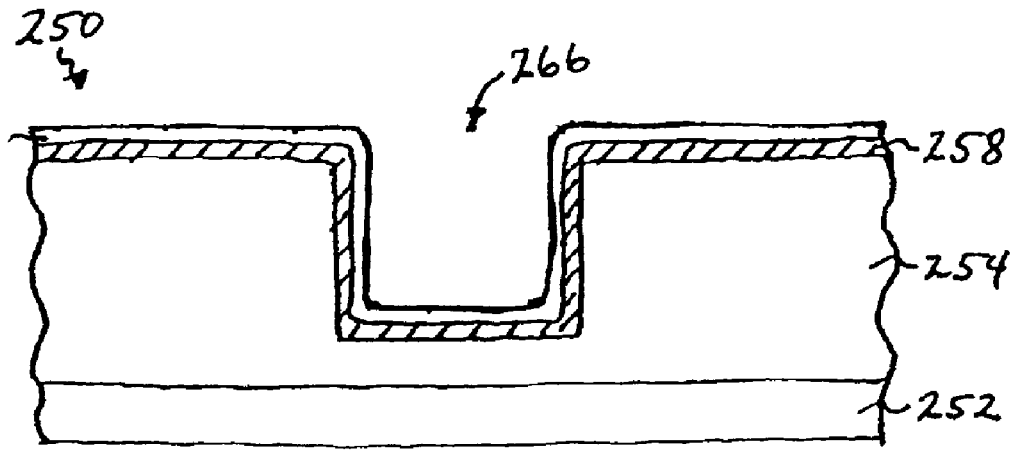

As shown in FIG. 12D, a second dielectric layer (e.g., insulator) 262 is formed over the first metal layer 258 by any oxidation technique. The second dielectric layer 262 is formed along the walls of the opening 260 and over the exposed top surface of the first metal layer 258. After the second dielectric layer 262 is formed, excess materials can be removed, e.g., by photolithography and etching, to form an opening 266.

Figure 12E:
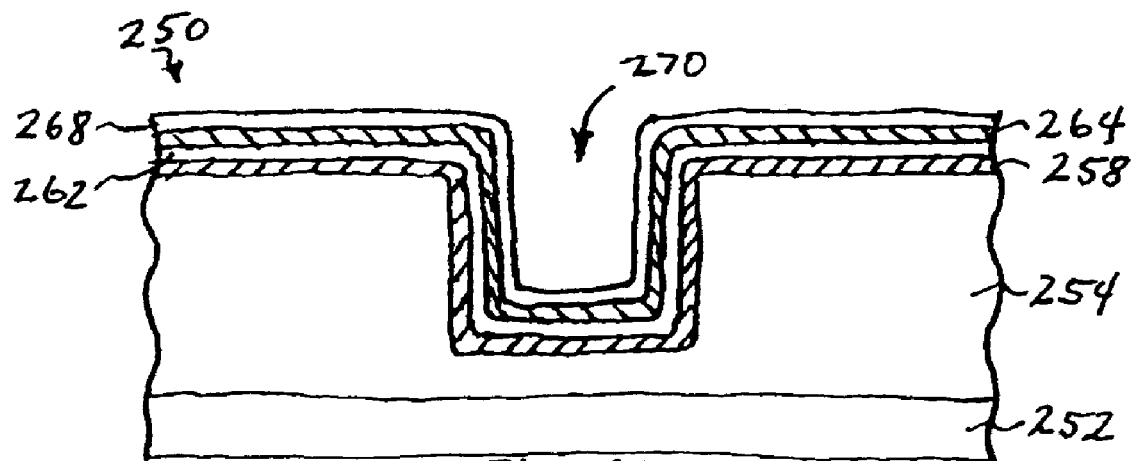

Next, as shown in FIG. 12E, an electrode 264 is deposited, e.g., by any thin-film deposition technique, along the walls of the opening 266 and over the exposed top surface of the second dielectric layer 262. A via or other conductive structure (not shown) can be formed by known techniques to connect the electrode 264 to a semiconductor device within or over the substrate 252. After the electrode 264 is formed, excess materials can be removed, e.g., by photolithography and etching. Next, layers of an MTJ structure 268 are deposited over the electrode 264. The MTJ structure 268 can include a first ferromagnetic layer formed by thin-film deposition, a spacer layer of non-magnetic material formed over the first ferromagnetic layer by any oxidation technique, and a second ferromagnetic layer formed over the non-magnetic layer by thin-film deposition. The MTJ structure 268 can also include an antiferromagnetic layer formed between the electrode 264 and the first ferromagnetic layer for pinning the magnetization direction of the first ferromagnetic layer. After each layer of the MTJ structure 268 is formed, excess materials can be removed, e.g., by photolithography and etching, to form an opening 270.

Figure 12F:
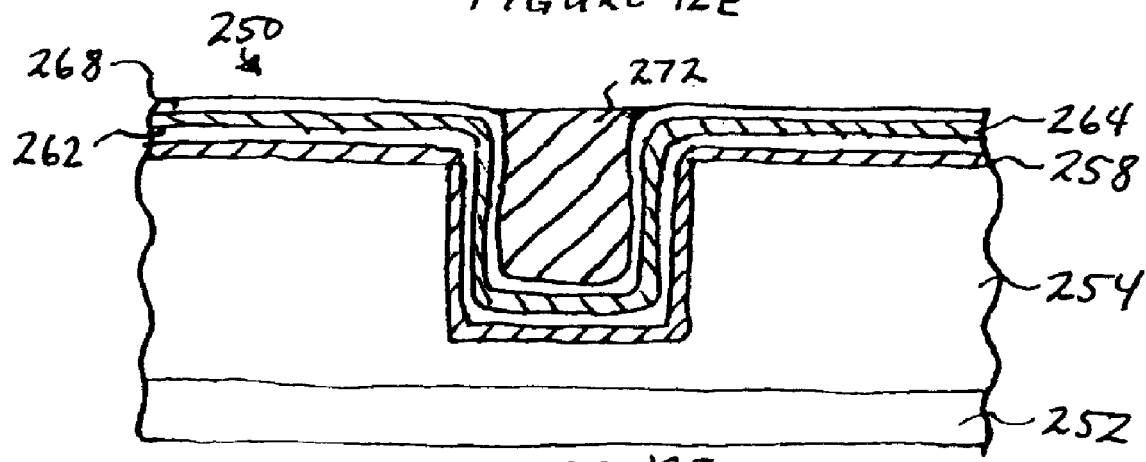

Next, as shown in FIG. 12F, a second metal layer 272 is deposited in the opening 270. The second metal layer 272 can be deposited by any thin-film deposition technique, e.g., electroplating or sputtering. The second metal layer 272 serves as a conducting line (e.g., bit line) of the MRAM device 250 and will be connected to periphery CMOS controlling transistors which regulate the reading and writing of the memory cells. The MRAM device 250 can be planarized by an etch back or a chemical mechanical polishing (CMP) process, particularly in order to remove portions of the second metal layer 272 that are not within the opening 270.

Figure 13A:
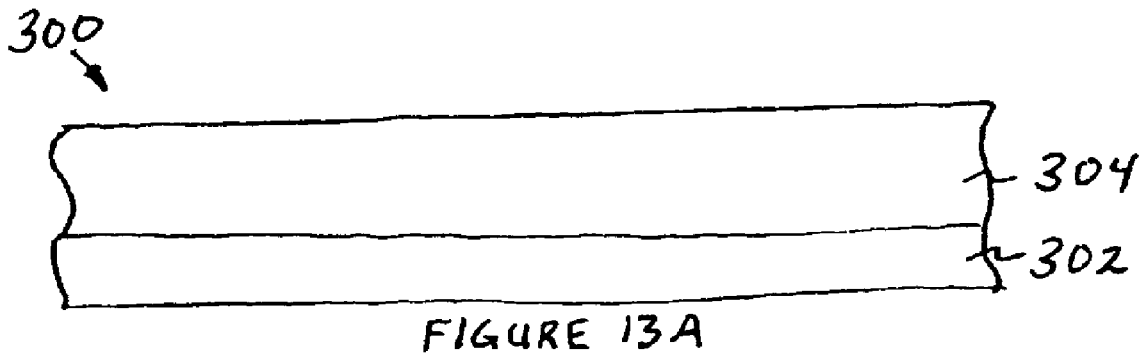
FIGS. 13A through 13E show a third embodiment of a process for fabricating a memory cell having an inflected magnetoresistive structure.

FIG. 13A illustrates in a cross-sectional view a substrate 302 on which a magnetic random access memory (MRAM) device 300 is formed. Although not shown, semiconductor devices and other layers may be formed within or over the substrate 302. For example, logic transistors may be formed in the substrate 302 using conventional methods. A first dielectric layer 304 is formed over the substrate 302 by chemical vapor deposition (CVD), physical vapor deposition (PVD), thermal growth, or combinations thereof.

Figure 13B:
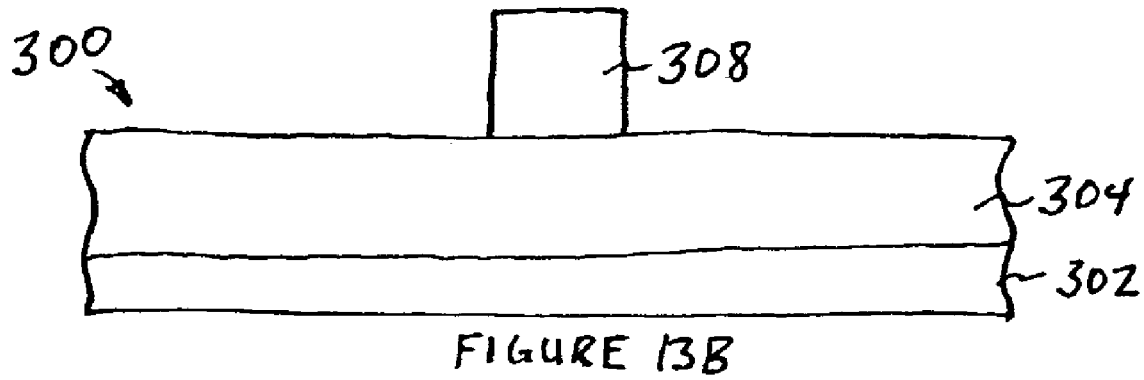

As shown in FIG. 13B, a first metal layer 308 is deposited over the first dielectric layer 304. The first metal layer 308 can be deposited by any thin-film deposition technique, e.g., electroplating or sputtering. The first metal layer 308 is patterned, e.g., by photolithography and etching, to form a structure that extends in and out of the page. The first metal layer 308 serves as a conducting line (e.g., bit line) of the MRAM device 300 and will be connected to periphery CMOS controlling transistors which regulate the reading and writing of the memory cells.

Figure 13C:
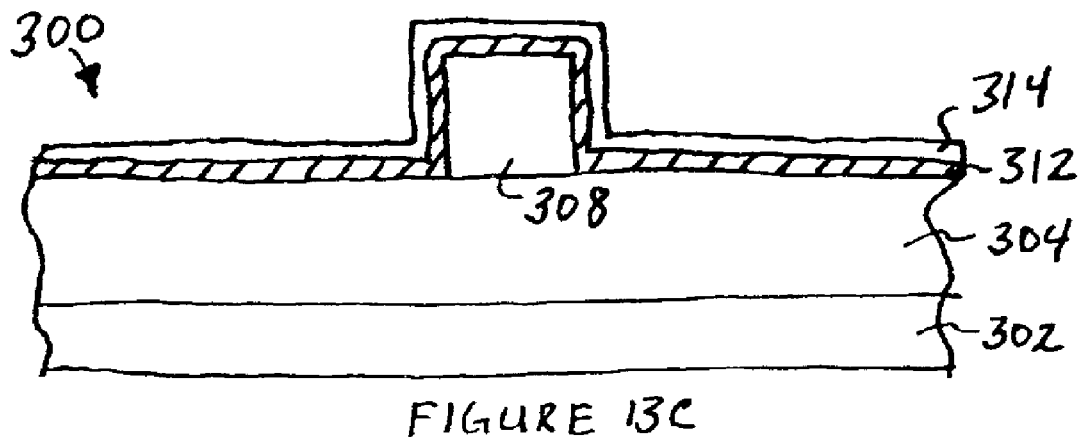

Next, as shown in FIG. 13C, layers of an MTJ structure 312 are deposited over the first metal layer 308 and over the exposed top surface of the first dielectric layer 304. The MTJ structure 312 can include a first ferromagnetic layer formed by thin-film deposition, a spacer layer of non-magnetic material formed over the first ferromagnetic layer by any oxidation technique, and a second ferromagnetic layer formed over the non-magnetic layer by thin-film deposition. The MTJ structure 312 can also include an antiferromagnetic layer formed over the second ferromagnetic layer for pinning the magnetization direction of the second ferromagnetic layer. After each layer of the MTJ structure 312 is formed, excess materials can be removed, e.g., by photolithography and etching. Next, an electrode 314 is deposited, e.g., by any thin-film deposition technique, over the MTJ structure 312. A via or other conductive structure (not shown) can be formed by known techniques to connect the electrode 314 to a semiconductor device within or over the substrate 302. After the electrode 314 is formed, excess materials can be removed, e.g., by photolithography and etching.

Figure 13D:
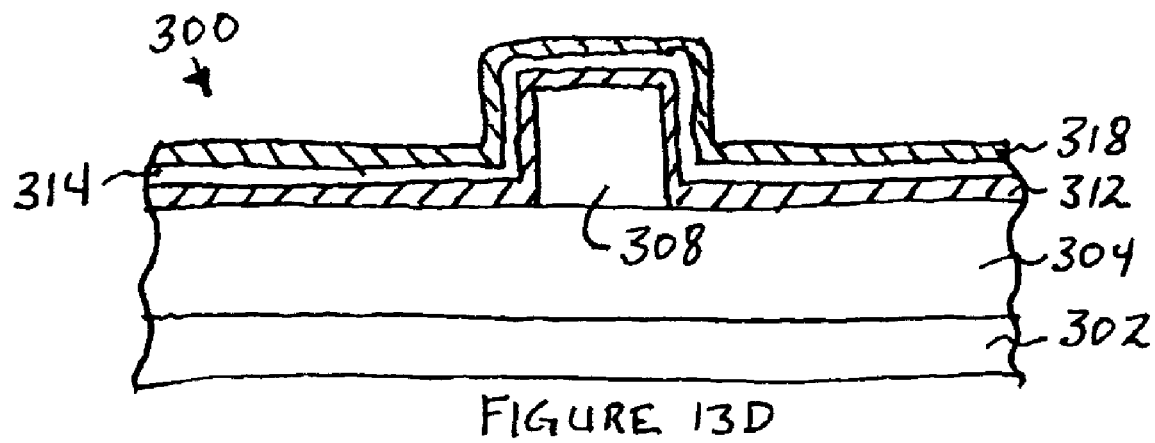

Next, as shown in FIG. 13D, a second dielectric layer (e.g., insulator) 318 is formed over the electrode 314 by any oxidation technique. After the second dielectric layer 318 is formed, excess materials can be removed, e.g., by photolithography and etching.

Figure 13E:
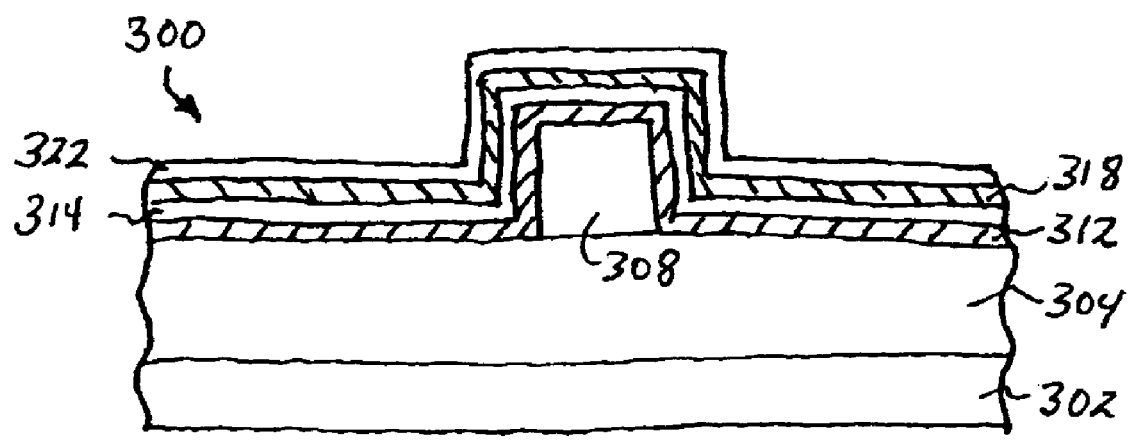

Next, as shown in FIG. 13E, a second metal layer 322 is deposited in the opening 120. The second metal layer 322 can be deposited by any thin-film deposition technique, e.g., electroplating or sputtering. The second metal layer 322 serves as a conducting line (e.g., program line) of the MRAM device 300 and will be connected to periphery CMOS controlling transistors which regulate the reading and writing of the memory cells. After the second metal layer 322 is formed, excess materials can be removed, e.g., by photolithography and etching.

Figure 14A:
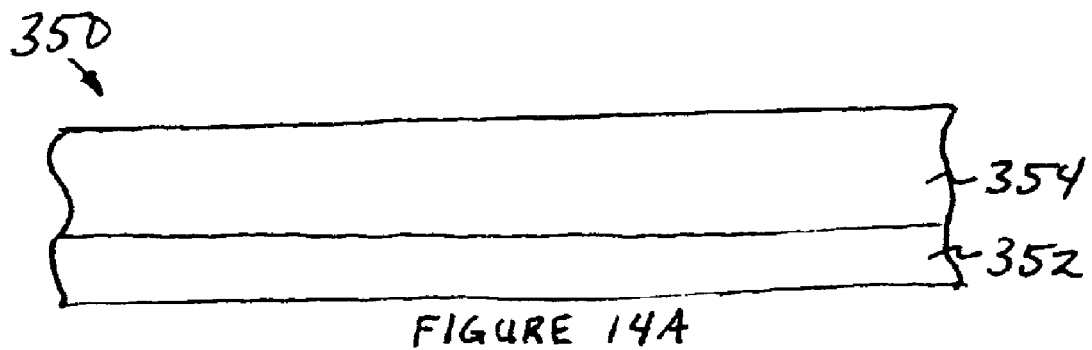
FIGS. 14A through 14E show a fourth embodiment of a process for fabricating a memory cell having an inflected magnetoresistive structure.

FIG. 14A illustrates in a cross-sectional view a substrate 352 on which a magnetic random access memory (MRAM) device 350 is formed. Although not shown, semiconductor devices and other layers may be formed within or over the substrate 352. For example, logic transistors may be formed in the substrate 352 using conventional methods. A first dielectric layer 354 is formed over the substrate 352 by chemical vapor deposition (CVD), physical vapor deposition (PVD), thermal growth, or combinations thereof.

Figure 14B:
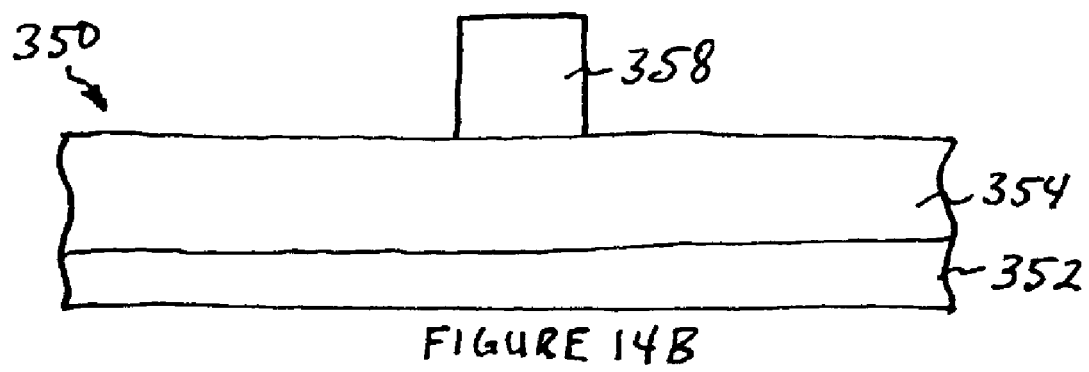

As shown in FIG. 14B, a first metal layer 358 is deposited over the first dielectric layer 354. The first metal layer 358 can be deposited by any thin-film deposition technique, e.g., electroplating or sputtering. The first metal layer 358 is patterned, e.g., by photolithography and etching, to form a structure that extends in and out of the page. The first metal layer 358 serves as a conducting line (e.g., program line) of the MRAM device 350 and will be connected to periphery CMOS controlling transistors which regulate the reading and writing of the memory cells.

Figure 14C:
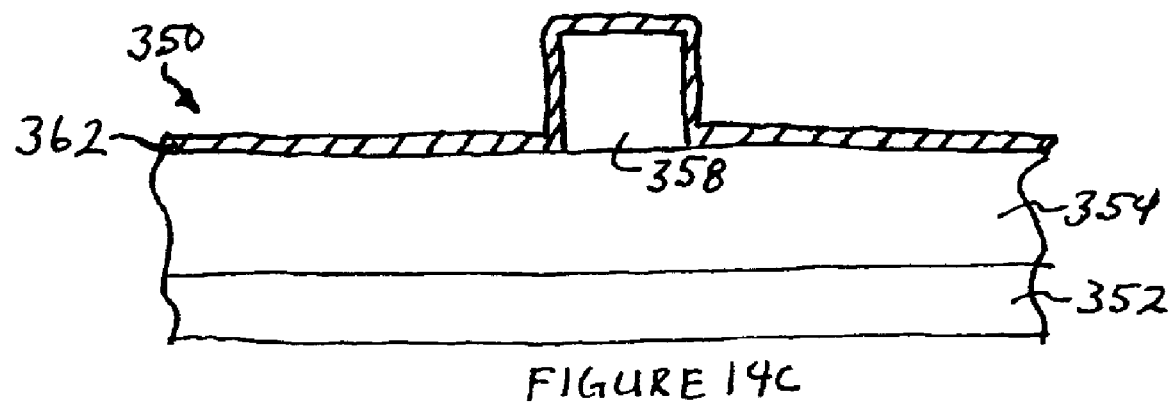

Next, as shown in FIG. 14C, a second dielectric layer (e.g., insulator) 362 is formed over the first metal layer 358 and over the exposed top surface of the first dielectric layer 354. After the second dielectric layer 362 is formed, excess materials can be removed, e.g., by photolithography and etching.

Figure 14D:
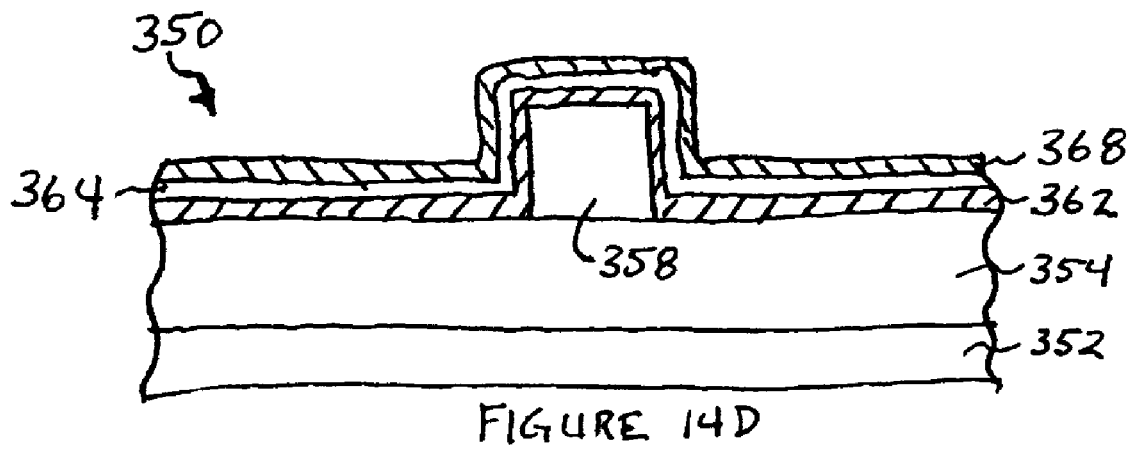

Next, as shown in FIG. 14D, an electrode 364 is deposited, e.g., by any thin-film deposition technique, over the second dielectric layer 354. A via or other conductive structure (not shown) can be formed by known techniques to connect the electrode 364 to a semiconductor device within or over the substrate 352. After the electrode 364 is formed, excess materials can be removed, e.g., by photolithography and etching. Next, layers of an MTJ structure 368 are deposited over the electrode 364. The MTJ structure 368 can include a first ferromagnetic layer formed by thin-film deposition, a spacer layer of non-magnetic material formed over the first ferromagnetic layer by any oxidation technique, and a second ferromagnetic layer formed over the non-magnetic layer by thin-film deposition. The MTJ structure 368 can also include an antiferromagnetic layer formed between the electrode 364 and the first ferromagnetic layer for pinning the magnetization direction of the first ferromagnetic layer. After each layer of the MTJ structure 368 is formed, excess materials can be removed, e.g., by photolithography and etching.

Figure 14E:
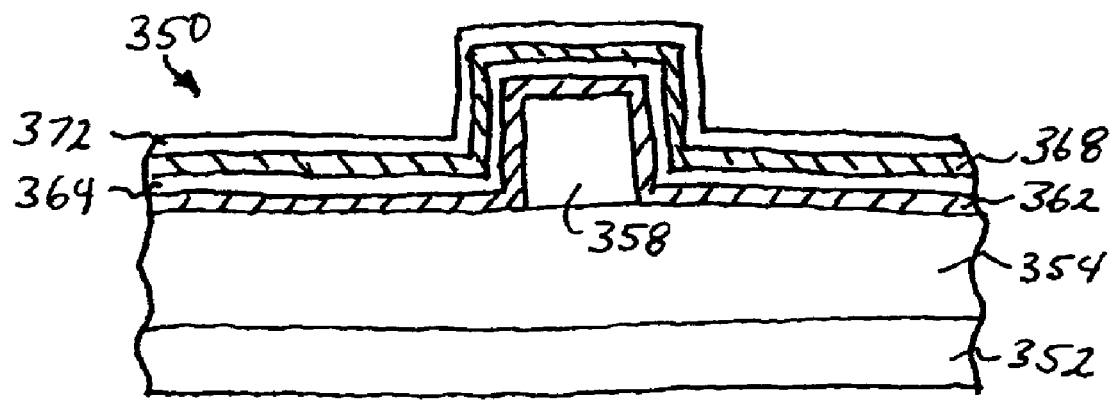

Next, as shown in FIG. 14E, a second metal layer 372 is deposited over the MTJ structure 368. The second metal layer 372 can be deposited by any thin-film deposition technique, e.g., electroplating or sputtering. The second metal layer 372 serves as a conducting line (e.g., bit line) of the MRAM device 350 and will be connected to periphery CMOS controlling transistors which regulate the reading and writing of the memory cells. After the second metal layer 372 is formed, excess materials can be removed, e.g., by photolithography and etching.

Materials used in any of the above-described embodiments can be selected as follows. The substrate can be an SOI substrate or any type of substrate that includes silicon, germanium, and/or carbon. The first and second dielectric layers (including layers referred to as an insulator) can comprise be a silicon oxide or a silicon nitride, for example silicon dioxide formed using tetraethylorthosilane (TEOS), or any other dielectric material, such as a low dielectric constant material (i.e., a dielectric material with a dielectric constant less than that of silicon dioxide). The metal layers (e.g., bit lines, program lines, electrodes) can be formed of a conductive material comprising metal, metal silicide, metal oxide, poly-Si, poly-SiGe, or combinations thereof. For example, the metal layers can comprise copper (Cu), aluminum (Al), tungsten (W), or gold (Au). The ferromagnetic layers can be formed of a ferromagnetic material comprising cobalt (Co), iron (Fe), nickel (Ni), or alloys containing these elements. For example, materials that can be used for the ferromagnetic layers can be a $Co_{90}Fe_{10}$ (at %) alloy, a CoFeNi alloy, or a $Ni_{80}Fe_{20}$ alloy (permalloy). The spacer layer can be a tunnel barrier formed of an insulating material, for example an aluminum oxide (e.g., $AlO_x$) such as $Al_2O_3$ or a nitride such as AlN. The antiferromagnetic layer can be formed of an antiferromagnetic material comprising a manganese (Mn)-based alloy containing, for example, iron (Fe), platinum (Pt), iridium (Ir), rhodium (Rh), ruthenium (Ru), or palladium (Pd). For example, materials that can be used for forming an AFM layer can be an FeMn alloy, a PtMn alloy, a PtPdMn alloy, or an IrMn alloy.

Additional layers (not shown) can be included in an inflected MR structure such as those described herein. For example, the ferromagnetic pinned layer can be a multi-layered structure. The ferromagnetic pinned layer can comprise a synthetic antiferromagnetic (SAF) structure that includes a pair of ferromagnetic layers separated by a layer of Ruthenium (Ru). It should also be noted that the use of the term "layer" should not be construed to impose limitations, particularly with respect to how a "layer" is formed, for example a "layer" as referred to herein can be formed by one or multiple layer-forming steps, such as using one or more steps of deposition for forming what is termed herein as a "layer". Examples of suitable thicknesses for the layers are summarized in Table 1 below, which can apply to any embodiment of the present inflected MR structures, including any of the disclosed embodiments. In Table 1, "FM FREE" refers to any ferromagnetic free layer, "FM PINNED" refers to any ferromagnetic pinned layer, "AFM" refers to any antiferromagnetic pinning layer, and "SPACER" refers to any spacer layer or tunnel barrier. It should be noted that these thicknesses are not intended to be limiting in any way, but instead are provided merely as examples.

TABLE 1

| Layer | Exemplary Thickness Range (Å) | Exemplary Thickness (Å) |
|---|---|---|
| FM FREE | 10-50 | 20 |
| FM PINNED | 10-50 | 20 |
| AFM | 100-500 | 200 |
| SPACER | 5-20 | 10 |

In the magnetoresistive structures described above, such as the magnetic tunnel junctions, the structure can include as a free/spacer/pinned/pinning series of layers. In such a structure, the magnetization direction of the free layer is free to change under the influence of an applied magnetic field. The magnetization direction of the pinned layer is fixed to a particular direction due to exchange coupling with an antiferromagnetic pinning layer. The antiferromagnetic layer can be initialized during manufacturing to have a particular exchange bias that determines the pinning direction, or the direction in which the magnetization direction of the ferromagnetic pinned layer will be set.

Figure 15:
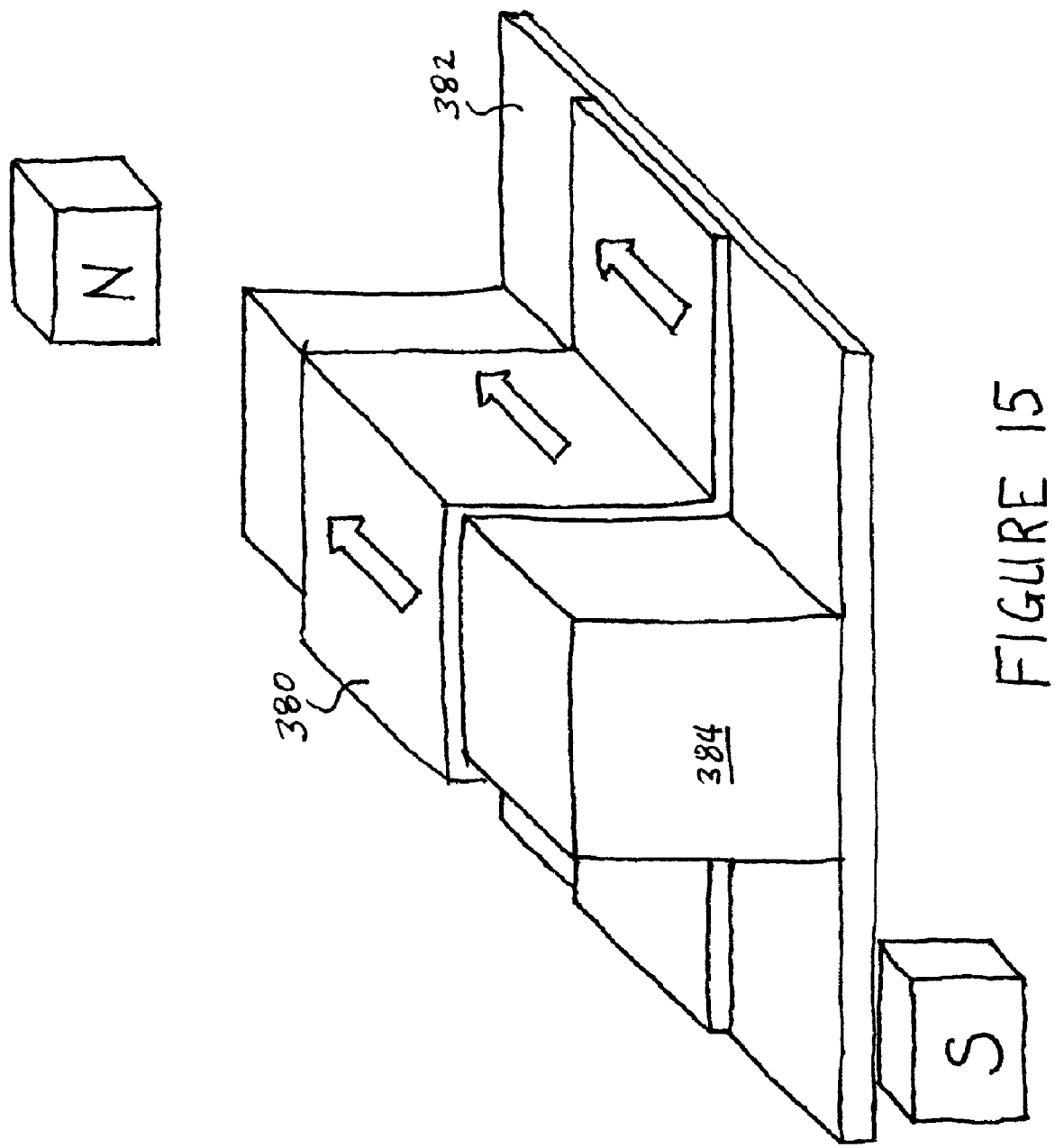
FIG. 15 shows a perspective view illustrating a process of initializing an inflected magnetoresistive structure.

The exchange bias of the antiferromagnetic layer can be set using an initialization process that will be described with reference to FIG. 15. A structure 380 shown in FIG. 15 can be an MTJ structure comprising an antiferromagnetic pinning layer and a ferromagnetic pinned layer. The structure 380 is formed over a substrate 382, specifically over a step 384 of the substrate 382. Thus, the structure 380 is an inflected MR structure. In order to initialize the exchange bias of the antiferromagnetic layer and pin the ferromagnetic pinned layer, the structure 380 is heated to a blocking temperature (e.g., at or above the Néel temperature of the antiferromagnetic material) and then subsequently cooled to an ambient temperature in the presence of a magnetic field. The blocks labeled "N" and "S" are shown in FIG. 15 for conceptual purposes in order to illustrate the presence of a magnetic field. The arrows illustrate the direction of the magnetic dipole moment of the applied magnetic field.

During the initialization process, a strong magnetic field, for example a field of 2000 Oersteds, is applied in a direction parallel to the desired magnetization direction. The structure 380 is heated in the presence of the applied magnetic field to a blocking temperature, for example to a temperature greater than 200° C. such as a temperature in a range of 200° C. to 300° C. The structure 380 can be heated for any amount of time necessary, for example in a range of 15 minutes to several hours, depending upon the material. The structure 380 is then cooled in the presence of the applied magnetic field to fix the pinned layer magnetization and exchange bias at the desired direction. Magnetic exchange coupling between the antiferromagnetic layer and the pinned layer will keep the magnetization direction of the ferromagnetic pinned layer fixed, for example in the direction shown by the arrows in FIG. 15.

The configuration shown in FIG. 15 can be changed to allow for any shape of an inflected MR structure, including any of the embodiments disclosed above. Thus, the present initialization process can be used for any MR structure according to the present concepts, including those disclosed herein. The initialization process can be performed at any point subsequent to the forming of the antiferromagnetic pinning layer and the ferromagnetic pinned layer (e.g., before or after the formation of other layers).

Still further embodiments are possible that follow from the concepts and principles disclosed herein. For example, while inflected magnetoresistive structures have been disclosed herein having one or two inflections, further embodiments can have any number of inflections. While the inflections illustrated have been shown between substantially orthogonal portions, inflections can join portions having any angle there between. Inflections can include any non-planar feature, for example a bend, twist, fold, curve, turn, or other feature that results in a non-planar structure. Additional embodiments can include structures that might be considered a single continuous inflection, such as a dome-shaped structure, or multiple continuous inflections, such as a sin-wave-shaped structure. While the embodiments herein show the layers as all extending across the entirety of the structure, additional embodiments can have one or more layers that only extend for a portion or portions of the entirety of the structure. While the embodiments disclosed herein include structures having an inflection interposing structure portions that are horizontal and vertical relative to the substrate, additional embodiments can include structures having one or more inflections interposing structure portions that are at any angle relative to the substrate, including embodiments where one or more inflections interpose structure portions that are both at a same angle or both at different angles relative to the substrate, for example where an inflection interposes two structure portions that are vertical relative to the substrate or where an inflection interposes two structure portions that are horizontal relative to the substrate.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A magnetoresistive structure comprising:
   a first ferromagnetic layer;
   a second ferromagnetic layer;
   a spacer layer between the first ferromagnetic layer and the second ferromagnetic layer;
   first and second non-planar inflections shared by the first ferromagnetic layer, the spacer layer, and the second ferromagnetic layer, each of the layers collectively forming a non-planar magnetic storage stack having substantially the same shape through the first and second inflections and along the entire length of the magnetic storage stack, the magnetic storage stack operable to store a bit of data;
   wherein the first ferromagnetic layer, the second ferromagnetic layer, and the spacer layer extend together for a certain length, and wherein the first inflection is interposed between a first portion of the length that extends for a first distance in a first direction, and a second portion of the length that extends for a second distance in a second direction different than the first direction, and wherein the second inflection is interposed between the second portion of the length and a third portion of the length that extends for a third distance in the first direction, wherein the third portion is not over the first portion; and
   a conductive read/write line extending beyond maximum widths of the first ferromagnetic layer, the second ferromagnetic layer, and the spacer layer along a third direction orthogonal to the first and second directions, wherein the conductive read/write line passes above the second portion of the length and between the first and third portions of the length, a thickness of the conductive read/write line not extending above terminal ends of the first and third portions of the length.

2. A structure according to claim 1, further comprising an antiferromagnetic layer beneath the spacer layer.

3. A structure according to claim 1, wherein at least one of the first distance extending from the inflection to the end of the first portion, and the second distance extending from the inflection to the end of the second portion, is greater than about 10 angstroms.

4. A magnetoresistive structure comprising:
   a substrate;
   a non-planar magnetic storage stack formed over the substrate, the magnetic storage stack comprising a first ferromagnetic layer, a second ferromagnetic layer, a spacer layer between the first ferromagnetic layer and the second ferromagnetic layer, and first and second non-planar inflections shared by the first ferromagnetic layer, the spacer layer, and the second ferromagnetic layer;

wherein each of the layers has substantially the same shape through the first and second inflections and along the entire length of the magnetic storage stack;

wherein the first ferromagnetic layer, the second ferromagnetic layer, and the spacer layer extend together for a certain length, and wherein the first inflection is interposed between a first portion of the length that extends for a first distance in a first direction, and a second portion of the length that extends for a second distance in a second direction different than the first direction, and wherein the second inflection is interposed between the second portion of the length and a third portion of the length that extends for a third distance in the first direction, wherein the third portion is not over the first portion; and a conductive read/write line extending beyond maximum widths of the first ferromagnetic layer, the second ferromagnetic layer, and the spacer layer along a third direction orthogonal to the first and second directions, wherein the conductive read/write line passed above the second portion of the length and between the first and third portions of the length, a thickness of the conductive read/write line not extending above terminal ends of the first and third portions of the length.

5. A structure according to claim 4, further comprising an antiferromagnetic layer beneath the spacer layer.

6. A structure according to claim 5, wherein the antiferromagnetic layer comprises iron-manganese.

7. A structure according to claim 4, wherein the substrate comprises an insulating material.

8. A structure according to claim 4, wherein the substrate comprises a conductive or semi-conductive material.

9. A structure according to claim 4, wherein the layers of the magnetic storage stack comprise a magnetic tunnel junction stack and the spacer layer comprises a tunnel oxide layer.

10. A structure according to claim 9, wherein the tunnel oxide layer comprises aluminum oxide, magnesium oxide, or tantalum oxide.

11. A structure according to claim 9, wherein the tunnel oxide layer has a thickness that is less than or equal to about 20 angstroms.

12. A structure according to claim 4, wherein the first ferromagnetic layer comprises at least one of iron, cobalt, and nickel.

13. A structure according to claim 4, wherein the second ferromagnetic layer comprises at least one of iron, cobalt, and nickel.

14. A structure according to claim 4, further comprising a transistor between the substrate and the magnetic storage stack, and an electrode connected to the magnetic storage stack and the transistor.

15. A structure according to claim 4, wherein the inflection is a rounded corner.

16. A structure according to claim 4, wherein the inflection is a squared corner.

17. A structure according to claim 4, wherein the magnetic storage stack comprises a substantially vertical portion and a substantially horizontal portion, wherein the inflection is between the vertical and horizontal portions.

18. A plurality of magnetoresistive structures, each of the plurality of magnetoresistive structures comprising:

a first ferromagnetic layer;

a second ferromagnetic layer;

a spacer layer between the first ferromagnetic layer and the second ferromagnetic layer;

first and second non-planar inflections shared by the first ferromagnetic layer, the spacer layer, and the second ferromagnetic layer, each of the layers collectively forming a non-planar magnetic storage stack having substantially the same shape through the first and second inflections and along the entire length of the magnetic storage stack;

wherein the first ferromagnetic layer, the second ferromagnetic layer, and the spacer layer extend together for a certain length, and wherein the first inflection is interposed between a first portion of the length that extends for a first distance in a first direction, and a second portion of the length that extends for a second distance in a second direction different than the first direction, and wherein the second inflection is interposed between the second portion of the length and a third portion of the length that extends for a third distance in the first direction; and wherein at least one of the magnetoresistive structures in the plurality of magnetoresistive structures is electrically connected to at least one other of the magnetoresistive structures in the plurality of magnetoresistive structures via a conductive read/write line.

19. A structure according to claim 18, further comprising an antiferromagnetic layer beneath the spacer layer.

* * * * *